(12) United States Patent
Ha et al.

(10) Patent No.: US 7,702,970 B2
(45) Date of Patent: Apr. 20, 2010

(54) METHOD AND APPARATUS FOR DEINTERLEAVING INTERLEAVED DATA STREAM IN A COMMUNICATION SYSTEM

(75) Inventors: Sang-Hyuck Ha, Suwon-shi (KR); Seo-Weon Heo, Seoul (KR); Nam-Yul Yu, Suwon-shi (KR); Min-Goo Kim, Suwon-shi (KR); Seong-Woo Ahn, Yongin-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1302 days.

(21) Appl. No.: 10/695,390

(22) Filed: Oct. 29, 2003

(65) Prior Publication Data

US 2004/0114596 A1 Jun. 17, 2004

(30) Foreign Application Priority Data

Oct. 29, 2002 (KR) .................. 10-2002-0066189
Sep. 24, 2003 (KR) .................. 10-2003-0066400

(51) Int. Cl.
*G06F 11/00* (2006.01)
*G11C 29/00* (2006.01)

(52) U.S. Cl. ..................... 714/702; 714/701
(58) Field of Classification Search .......... 714/701, 714/702
See application file for complete search history.

(56) References Cited

U.S. PATENT DOCUMENTS 4,868,776 A * 9/1989 Gray et al. .......... 708/405
6,233,711 B1   5/2001 Murayama et al. .......... 714/786
6,351,460 B1 * 2/2002 Tiedemann et al. .......... 370/332
6,463,556 B1 * 10/2002 Shaffner et al. .......... 714/701
6,590,951 B1 * 7/2003 Kim et al. .......... 375/377
6,668,350 B1 * 12/2003 Kim .......... 714/759

FOREIGN PATENT DOCUMENTS

EP         0952673           10/1999

(Continued)

OTHER PUBLICATIONS

TIA/EIA/IS-2000.2-A-1, "Physical Layer Standard for CDMA2000 Spread Spectrum Systems", Telecommunications Industry Association, Nov. 2000.*

(Continued)

*Primary Examiner*—Joseph D Torres
(74) *Attorney, Agent, or Firm*—Roylance, Abrams, Berdo & Goodman L.L.P.

(57) ABSTRACT

An apparatus and method for reading written symbols by deinterleaving to decode a written encoder packet in a receiver for a mobile communication system supporting turbo coding and interleaving, such that a turbo-coded/interleaved encoder packet has a bit shift value m, an up-limit value J and a remainder R, and a stream of symbols of the encoder packet is written in order of column to row. The apparatus and method perform the operations of generating an interim address by bit reversal order (BRO) assuming that the remainder R is 0 for the received symbols; calculating an address compensation factor for compensating the interim address in consideration of a column formed with the remainder; and generating a read address by adding the interim address and the address compensation factor for a decoding-required symbol, and reading a symbol written in the generated read address.

16 Claims, 15 Drawing Sheets

FOREIGN PATENT DOCUMENTS

KR          0038959       7/2000
WO     WO 0035102 A 1    * 12/1998

OTHER PUBLICATIONS

TIA/EIA/IS-2000.2-C, "Physical Layer Standard for cdma2000 Spread Spectrum Systems", Telecommunications Industry Association, May 2002.*

TSGR1#5(99)737, Proposal for an interleaver for Serially Concatenated Convolutional Codes (Revised), Samsung Electronics Co., Jun. 1-4, 1999, pp. 1-9.*

A. Mark Earnshaw et al., "A Combined Soft-Decision Deinterleaver/Decoder for IS95 Reverse Link", *IEEE Transactions on Vehicular Technology*, vol. 49, pp. 448-456 (Mar. 2002).

3$^{rd}$ Generation Partnership Project 2 "3GPP2," *Physical Layer Standard for cdma2000 Spread Spectrum Systems—Release C*, 3GPP2 C.S002-C, Version 1.0, May 28, 2002.

3GPP/TSGR.1#3(99)-299, TSG-RAN Working Group 1 Meeting #3, "*Complexity Analysis of the Motorola Turbo Code Interleaver*," Eskilstuna, Sweden; Mar. 22-26, 1999; XP-002194524.

"*Physical Layer Standard for cdma2000 Spread Spectrum Systems Addendum 1*," TIA/EIA/IS-2000.2-A1, Telecommunications Industry Association; Nov. 1, 2000; XP-002273874.

* cited by examiner

EXAMPLE) m=4, J=2, and R=4

| ROW INDEX | BEFORE ROW BRO | AFTER ROW BRO |
|---|---|---|
| 0 | 0  16 | 0  16 |
| 1 | 1  17 | 8 |
| 2 | 2  18 | 4 |
| 3 | 3  19 | 12 |
| 4 | 4 | 2  18 |
| 5 | 5 | 10 |
| 6 | 6 | 6 |
| 7 | 7 | 14 |
| 8 | 8 | 1  17 |
| 9 | 9 | 9 |
| 10 | 10 | 5 |
| 11 | 11 | 13 |
| 12 | 12 | 3  19 |
| 13 | 13 | 11 |
| 14 | 14 | 7 |
| 15 | 15 | 15 |

FIG.6

| C.S. INDEX : k | 0 | 8 | 4 | 12 | 2 | 10 | 6 | 14 | 1 | 9 | 5 | 13 | 3 | 11 | 7 | 15 |
|---|---|---|---|---|---|---|---|---|---|---|---|---|---|---|---|---|
| | | 16 | | | 18 | | | | 17 | | | | 19 | | | |
| ROW INDEX : $r_k$ | 0 | 1 | 2 | 3 | 4 | 5 | 6 | 7 | 8 | 9 | 10 | 11 | 12 | 13 | 14 | 15 |
| INTERIM ADDR. : $IA_k$ | [0] [1] | [1] | [2] | [3] | [4] [5] | [5] | [6] | [7] | [8] [9] | [9] | [10] | [11] | [12] [13] | [13] | [14] | [15] |
| COMP. FACTOR : $C(r_k)$ | 0 | 1 | 1 | 1 | 2 | 2 | 2 | 2 | 3 | 3 | 3 | 3 | 4 | 4 | 4 | 4 |
| READ ADDR. : $A_k$ | [0] [1] | [2] | [3] | [4] | [5] [6] | [7] | [8] | [9] | [10] [11] | [12] | [13] | [14] | [15] [16] | [17] | [18] | [19] |

FIG.7

EXAMPLE) m=4, J=2, and R=12

| ROW INDEX | BEFORE ROW BRO | | AFTER ROW BRO | |
|---|---|---|---|---|
| 0  | 0  | 16 | 0  | 16 |
| 1  | 1  | 17 | 8  | 24 |
| 2  | 2  | 18 | 4  | 20 |
| 3  | 3  | 19 | 12 | [28] |
| 4  | 4  | 20 | 2  | 18 |
| 5  | 5  | 21 | 10 | 26 |
| 6  | 6  | 22 | 6  | 22 |
| 7  | 7  | 23 | 14 | [30] |
| 8  | 8  | 24 | 1  | 17 |
| 9  | 9  | 25 | 9  | 25 |
| 10 | 10 | 26 | 5  | 21 |
| 11 | 11 | 27 | 13 | [29] |
| 12 | 12 | [28] | 3  | 19 |
| 13 | 13 | [29] | 11 | 27 |
| 14 | 14 | [30] | 7  | 23 |
| 15 | 15 | [31] | 15 | [31] |

| C.S. INDEX :k | ROW INDEX :r_k | INTERIM ADDR. :IA_k | COMP. FACTOR :C(r_k) | READ ADDR. :A_k |
|---|---|---|---|---|
| 0 | 0 | [0] | 0 | [0] |
| 8 | 1 | [2] | 0 | [2] |
| 4 | 2 | [4] | −1 | [4] |
| 12 | 3 | [6] | −1 | [6] |
| 2 | 4 | [8] | −1 | [7] |
| 10 | 5 | [10] | −2 | [9] |
| 6 | 6 | [12] | −2 | [11] |
| 14 | 7 | [14] | −2 | [13] |
| 1 | 8 | [16] | −2 | [14] |
| 9 | 9 | [18] | −3 | [16] |
| 5 | 10 | [20] | −3 | [18] |
| 13 | 11 | [22] | −3 | [20] |
| 3 | 12 | [24] | −3 | [21] |
| 11 | 13 | [26] |  | [23] |
| 7 | 14 | [28] |  | [25] |
| 15 | 15 | [30] |  | [27] |
| 16 | 0 | [1] | 0 | [1] |
| 24 | 1 | [3] | 0 | [3] |
| 20 | 2 | [5] | −1 | [5] |
| 28 | 3 |  | −1 | [8] |
| 18 | 4 | [9] | −1 | [10] |
| 26 | 5 | [11] | −2 | [12] |
| 22 | 6 | [13] | −2 | [15] |
| 30 | 7 |  | −2 | [17] |
| 17 | 8 | [17] | −2 | [19] |
| 25 | 9 | [19] | −3 | [22] |
| 21 | 10 | [21] | −3 | [24] |
| 29 | 11 |  | −3 | [26] |
| 19 | 12 | [25] | −3 |  |
| 27 | 13 | [27] |  |  |
| 23 | 14 | [29] |  |  |
| 31 | 15 |  |  |  |

METHOD AND APPARATUS FOR DEINTERLEAVING INTERLEAVED DATA STREAM IN A COMMUNICATION SYSTEM

PRIORITY

This application claims priority under 35 U.S.C. §119 to an application entitled "Method and Apparatus for Deinterleaving Interleaved Data Stream in a Communication System" filed in the Korean Intellectual Property Office on Oct. 29, 2002 and assigned Serial No. 2002-66189, and an application entitled "Method and Apparatus for Deinterleaving Interleaved Data Stream in a Communication System" filed in the Korean Intellectual Property Office on Sep. 24, 2003 and assigned Serial No. 2003-66400, the contents of both of which are incorporated herein by reference.

BACKGROUND OF THE INVENTION

1. Field of the Invention

The present invention relates generally to a high-speed packet data communication system, and in particular, to a method and apparatus for receiving interleaved data and deinterleaving the received interleaved data into its original data format.

2. Description of the Related Art

A Code Division Multiple Access (CDMA) mobile communication system, for example, a CDMA IS-2000 system and a Universal Mobile Telecommunication Service (UMTS) Wideband CDMA (WCDMA) system, supports both a voice service and a circuit data service.

A synchronous CDMA2000 Release A/B mobile communication system and an asynchronous UMTS mobile communication system employ turbo coding and interleaving for reliable transmission of multimedia data. It is well known that turbo coding provides a very high information restoration capability in view of a bit error rate (BER) even at a low signal-to-noise ratio (SNR), and interleaving prevents defective bits in a fading environment from concentrating on one point. The interleaving allows adjacent bits to randomly undergo fading effects to prevent a burst error, thereby contributing to an increase in channel coding effects.

To meet increasing demand for a service requiring high-speed packet data transmission, such as the Internet and moving image services, a mobile communication system tends to develop into a system supporting a high-speed packet data service. According to CDMA2000 Release C/D, known as Evolution in Data and Voice (1xEV-DV) standard, driven by Third Generation Partnership Project (3GPP) and Third Generation Partnership Project 2 (3GPP2), a base station segments code symbols generated by encoding a transmission packet data stream by a channel encoder into subblocks with a predetermined size, and interleaves the respective segmented subblocks. A mobile station receives a stream of the interleaved subblocks, converts the received subblock stream into code symbols, and performs deinterleaving, a reverse operation of interleaving used in the base station, on the code symbols, to thereby restore the received subblock stream into the original signal output from the channel encoder.

In the CDMA2000 Release A/B standard, a length of a code symbol stream which becomes the subject of interleaving must be divided by a power of 2. That is, it is provided that a length of a code symbol stream should become a multiple of a number having 2 as its base and having a bit shift value, one of interleaving parameters, as its exponent. On the contrary, in 1xEV-DV, a length of a subblock code symbol stream is not divided by a power of 2. That is, the 1xEV-DV standard defines an interleaving rule different from that of the existing standards. Hence, the 1xEV-DV standard needs technologies for enabling a mobile station to receive a data stream interleaved according to the new interleaving rule and rapidly effectively deinterleave the received data stream.

SUMMARY OF THE INVENTION

It is, therefore, an object of the present invention to provide a method and apparatus for rapidly restoring, by a receiver, data that was interleaved by a transmitter before being transmitted, in a communication system.

It is another object of the present invention to provide a method and apparatus for performing subblock deinterleaving on forward packet data in a receiver of a communication system.

It is further another object of the present invention to provide a method and apparatus for performing deinterleaving using an input buffer of a channel decoder in a receiver of a communication system.

It is yet another object of the present invention to provide a method and apparatus for reading interleaved data, writing the received interleaved data, and reading the written data in order of deinterleaving in a communication system.

It still another object of the present invention to provide a method and apparatus for receiving interleaved data, writing the received interleaved data, and reading the written data using a read address created according to a deinterleaving rule in a 1xEV-DV communication system.

To achieve the above and other objects, there is provided a method for reading written symbols by deinterleaving to decode a written encoder packet in a receiver for a mobile communication system supporting turbo coding and interleaving, wherein a turbo-coded/interleaved encoder packet has a bit shift value m, an up-limit value J and a remainder R, and a stream of symbols of the encoder packet is written in order of column to row. The method comprises the steps of: generating an interim address by bit reversal order (BRO) assuming that the remainder R is 0 for the received symbols; calculating an address compensation factor for compensating the interim address in consideration of a column formed with the remainder; and generating a read address by adding the interim address and the address compensation factor for a decoding-required symbol, and reading a symbol written in the generated read address.

To achieve the above and other objects, there is provided an apparatus for reading written symbols by deinterleaving in a receiver for a communication system supporting turbo decoding and interleaving, wherein a turbo-coded/interleaved encoder packet has a bit shift value m, an up-limit value J and a remainder R, the receiver including a buffer for writing symbols of the encoder packet in order of column to row and a channel decoder for decoding the written encoder packet. The apparatus comprises an interim address generator for generating an interim address by performing a bit reversal order (BRO) operation on an index of a code symbol requested by the channel decoder, without considering the last column of symbols written in the buffer in the form of a matrix; an address compensator for calculating an address compensation factor for compensating the interim address in consideration of a column formed of the remainder; and an adder for generating a read address for reading a code symbol requested by the channel decoder from the buffer, by adding the address compensation factor to the interim address.

BRIEF DESCRIPTION OF THE DRAWINGS

The above and other objects, features and advantages of the present invention will become more apparent from the following detailed description when taken in conjunction with the accompanying drawings in which:

FIG. 6 illustrates a matrix of code symbols formed by applying an encoder packet size and interleaving parameters given in Example 1;

FIG. 7 illustrates a row index, an interim address, an address compensation factor, and a final read address, generated for a code symbol index in Example 1;

FIG. 8 illustrates a matrix of code symbols formed by applying an encoder packet size and interleaving parameters given in Example 2;

FIG. 9 sequentially illustrates a row index, an interim address, an address compensation factor, and a final read address, generated for a code symbol index in Example 2;

DETAILED DESCRIPTION OF THE PREFERRED EMBODIMENT

Figure 1:
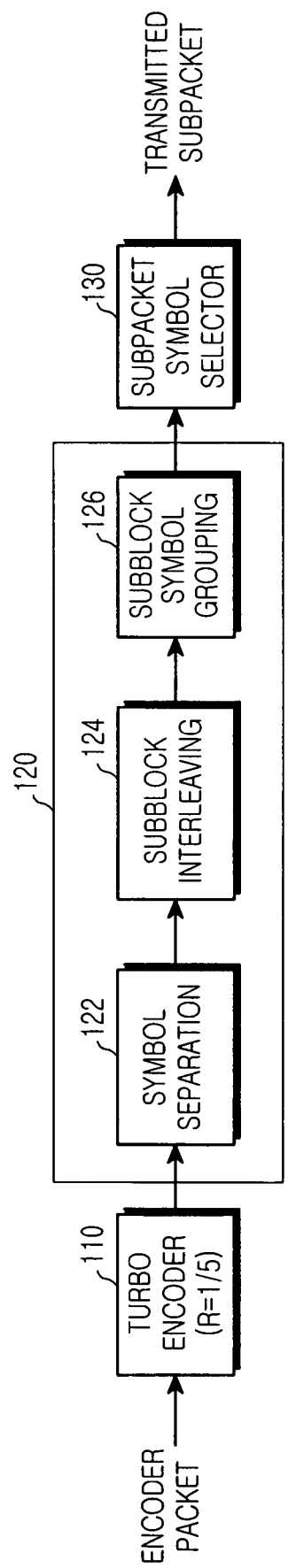
FIG. 1 is a block diagram illustrating a structure of a base station transmitter for generating a transmission subpacket by interleaving packet data for a forward packet data channel.

Several embodiments of the present invention will now be described in detail with reference to the accompanying drawings. In the drawings, the same or similar elements are denoted by the same reference numerals. In the following description, a detailed description of known functions and configurations incorporated herein has been omitted for conciseness.

The present invention receives a stream of interleaved packet data and deinterleaves the received interleaved packet data stream. Particularly, the invention deinterleaves a stream of packet data that was interleaved according to the CDMA2000 1xEV-DV (Evolution in Data and Voice) standard for a synchronous CDMA communication system.

A description will first be made of a structure and operation for interleaving a stream of packet data and deinterleaving a stream of the interleaved data in a CDMA2000 1xEV-DV mobile communication system.

FIG. 1 is a block diagram illustrating a structure of a base station transmitter for generating a transmission subpacket by interleaving packet data for a forward packet data channel.

Referring to FIG. 1, a turbo encoder 110 encodes a stream of input packet data by the encoder packet at a predetermined code rate R and outputs a stream of code symbols. Here, the turbo encoder 110 having a R=1/5 code rate specified in the 1xEV-DV standard is comprised of one turbo interleaver and two constituent encoders. An operation of the turbo encoder 110 will now be described. An input encoder packet is output as a systematic subpacket S as it is without modification, and a first constituent encoder encodes the input encoder packet and outputs 2 parity subblocks P0 and P1. The turbo interleaver constituting the turbo encoder 110 encodes the input encoder packet and generates another systematic subblock S'. The systematic subblock S' generated by the turbo interleaver is input to a second constituent encoder. The second constituent encoder encodes the systematic subblock S' and outputs other 2 different parity subblocks P0' and P1'. Since the systematic subblock S' is not output to the turbo encoder 110, the turbo encoder 110 outputs 5 subblocks S, P0, P1, P0', P1' having the same size as the input encoder packet.

A channel interleaver 120 properly interleaves code symbols output from the turbo encoder 110 so that code symbols constituting a subpacket guarantee coding gain on a high level. Code symbols output from the turbo encoder 110 are properly arranged. Such arrangement is performed by sequentially performing symbol separation, subblock interleaving, and subblock symbol grouping. Specifically, a symbol separator 122 classifies 5 kinds of code symbols output from the turbo encoder 110 according to symbol types, and forms 5 subblocks. A subblock interleaver 124 interleaves each of the 5 subblocks output from the symbol separator 122 according to the same interleaving rule. Finally, a subblock symbol grouper 126 alternately groups some code symbols in the interleaved subblocks.

Figure 2:
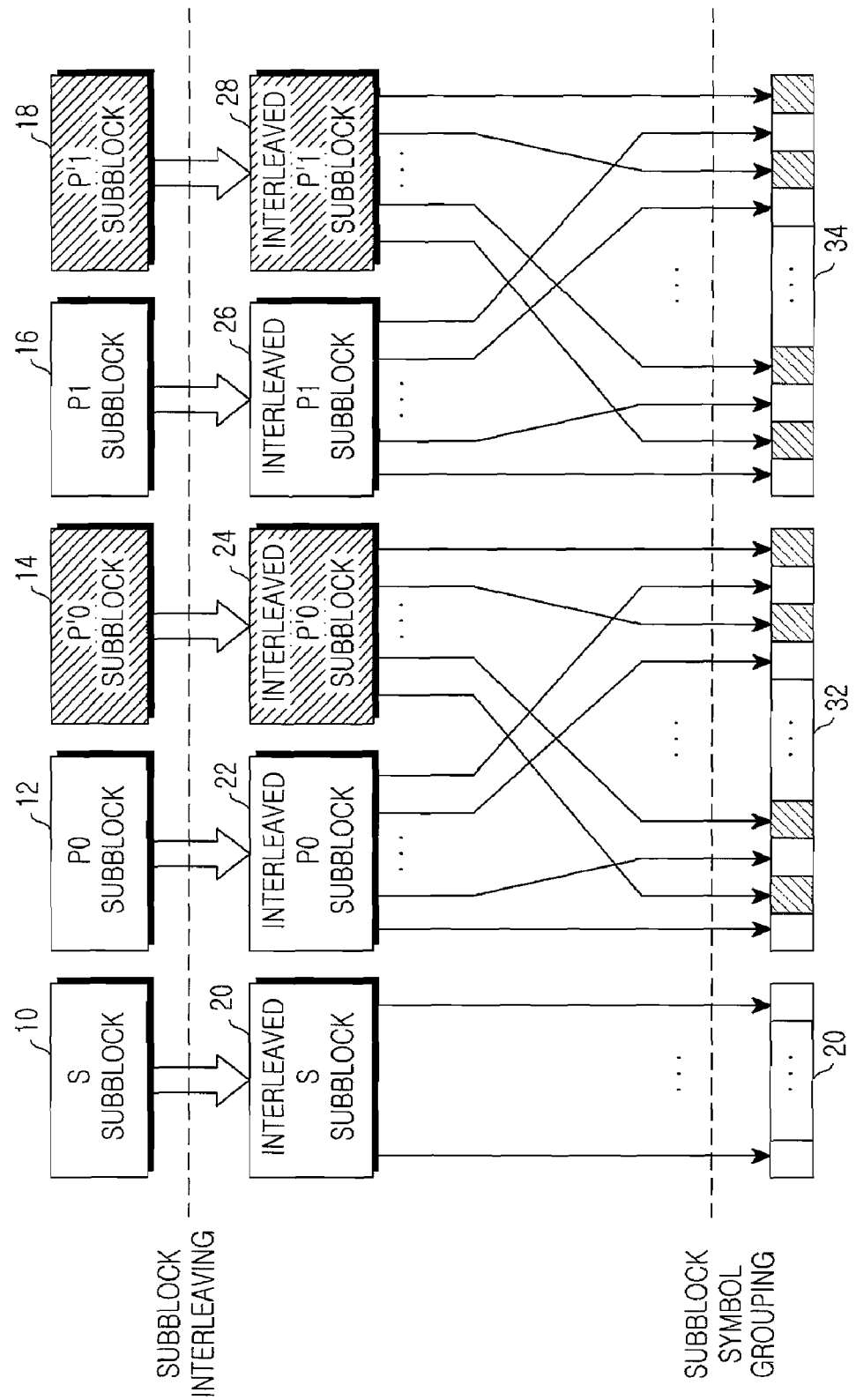
FIG. 2 illustrates subblock interleaving and subblock symbol grouping operations by a channel interleaver.

FIG. 2 illustrates subblock interleaving and subblock symbol grouping operations by the channel interleaver 120. As illustrated, 5 subblocks S, P0, P0', P1, P1' (represented by reference numerals 10 to 18) separated according to their types are subblock-interleaved by the subblock interleaver 124, and then output as interleaved subblocks 20 to 28. Thereafter, the subblock symbol grouper 128 alternately groups the interleaved parity symbols 22 to 28 without changing the interleaved systematic subblock 20, among the interleaved subblocks 20 to 28. Describing a grouping method, code symbols of the interleaved subblock P0 (22) and the interleaved subblock P0' (24) are alternately arranged to generate a first data group 32. Similarly, code symbols of the interleaved subblock P1 (26) and the interleaved subblock P1' (28) are alternately arranged to generate a second data group 34.

A subpacket symbol selector 130 selects some symbols from the data interleaved by the channel interleaver 120 according to a predetermined selection pattern, and generates a transmission subpacket. The generated subpacket is modulated with a predetermined modulation scheme and then transmitted to a mobile station through a well known procedure such as spreading and frequency conversion.

A mobile station, receiving high-speed packet data transmitted by a base station over a forward packet data channel, acquires decoded data by inversely performing the operation shown in FIG. 1.

Figure 3:
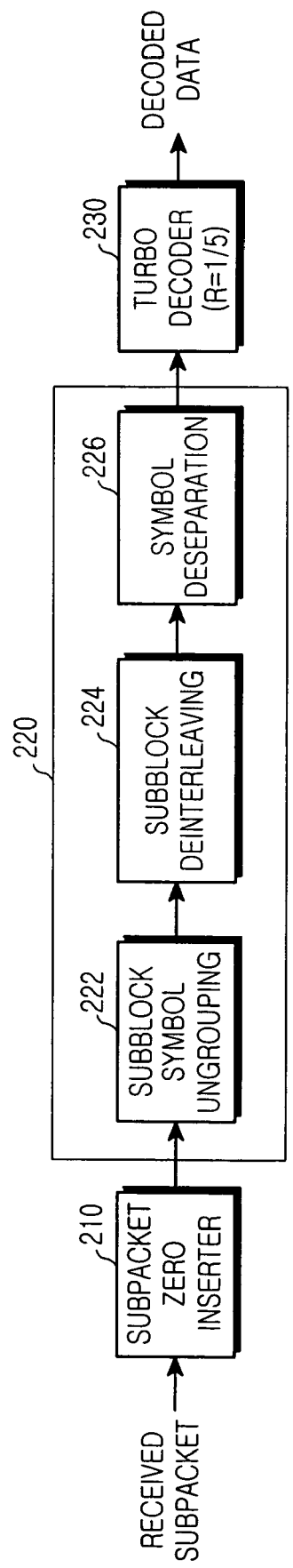
FIG. 3 illustrates a structure of a mobile station receiver for acquiring decoded data from a subpacket received over a forward packet data channel.

FIG. 3 illustrates a structure of a mobile station receiver for acquiring decoded data from a subpacket received over a forward packet data channel.

Referring to FIG. 3, a subpacket zero inserter 210 inserts '0' in a predetermined position of a received subpacket in association with the symbol selector 140 of the base station transmitter. A mobile station transmitter's channel deinterleaver 220 corresponding to the base station receiver's channel interleaver 120 sequentially performs subblock symbol ungrouping, subblock deinterleaving, and symbol deseparation.

More specifically, a subblock symbol ungrouper 222 separates subblocks output from the subpacket zero inserter 210 according their types, and outputs 5 interleaved subblocks. A subblock deinterleaver 224 deinterleaves each of the interleaved subblocks according to a deinterleaving rule corresponding to the interleaving rule used in the subblock interleaver 124 of the base station transmitter. Finally, a symbol deseparator 226 separates the deinterleaved output and provides its output to a channel decoder 230. The channel decoder 230 decodes the deinterleaved output at the same code rate as that of the turbo encoder 110 of the base station transmitter, and forms decoded data.

In the mobile station receiver operating in the above method, subblock deinterleaving must be performed by reflecting an interleaving rule used for subblock interleaving, and such interleaving has different complexity according to a length of an input sequence which becomes the subject of interleaving.

In reducing complexity of a mobile station receiver and improving a data processing speed, subblock deinterleaving can be performed using the following two methods. A first method is to perform deinterleaving when writing code symbols in an input buffer of a channel encoder, and in this case, write addresses of the input buffer for writing the code symbols are created considering a deinterleaving rule. A second method is to perform deinterleaving when a channel decoder reads code symbols from an input buffer, and in this case, read addresses of the input buffer for reading the code symbols are created considering a deinterleaving rule.

The former method must reflect not only subblock deinterleaving but also deshuffling accompanied by a demodulation process, when generating write addresses. Therefore, an additional control device is required according to a type of a modulation scheme and a deshuffling pattern, causing an increase in the complexity. Accordingly, the present invention provides a method for generating read addresses for reading code symbols from an input buffer of a channel decoder in performing subblock deinterleaving.

According to the 1xEV-DV standard, 11 encoder packet (EP) sizes available for a packet data channel (PDCH) transmitting traffic are specified in Table 1 below. Code symbols output from a channel encoder are interleaved according to subblocks, and in this case, since a size of each subblock is identical to a size of an encoder packet, a length of code symbol stream which becomes the subject of interleaving/deinterleaving is also identical to the size of the encoder packet.

Table 1 below shows sizes of an encoder packet, specified in the 1xEV-DV standard, and subblock interleaving/deinterleaving parameters according thereto. In Table 1, a bit shift value m and an up-limit value J are associated with the numbers of rows and the number of columns, respectively, when a stream of code symbols having a size $N_{EP}$ is arranged in the form of a matrix, and a remainder R means the number of elements in the last column of the matrix.

TABLE 1

| EP Size ($N_{EP}$) | Bit Shift (m) | Up Limit (J) | Remainder (R) |
| --- | --- | --- | --- |
| 408 | 7 | 4 | 24 |
| 792 | 8 | 4 | 24 |
| 1560 | 9 | 4 | 24 |
| 2328 | 10 | 3 | 280 |
| 3096 | 10 | 4 | 24 |
| 3864 | 11 | 2 | 1816 |
| 4632 | 11 | 3 | 536 |
| 6168 | 11 | 4 | 24 |
| 9240 | 12 | 3 | 1048 |
| 12312 | 12 | 4 | 24 |
| 15384 | 13 | 2 | 7192 |

As a result, a relation between the encoder packet size $N_{EP}$ and interleaving/deinterleaving parameters is defined as $$N_{EP} = 2^m \times (J-1) + R \qquad (1)$$

In order to describe a deinterleaving rule according to the present invention, a format of an interleaved data stream will first be described in detail by way of example.

Figure 4:
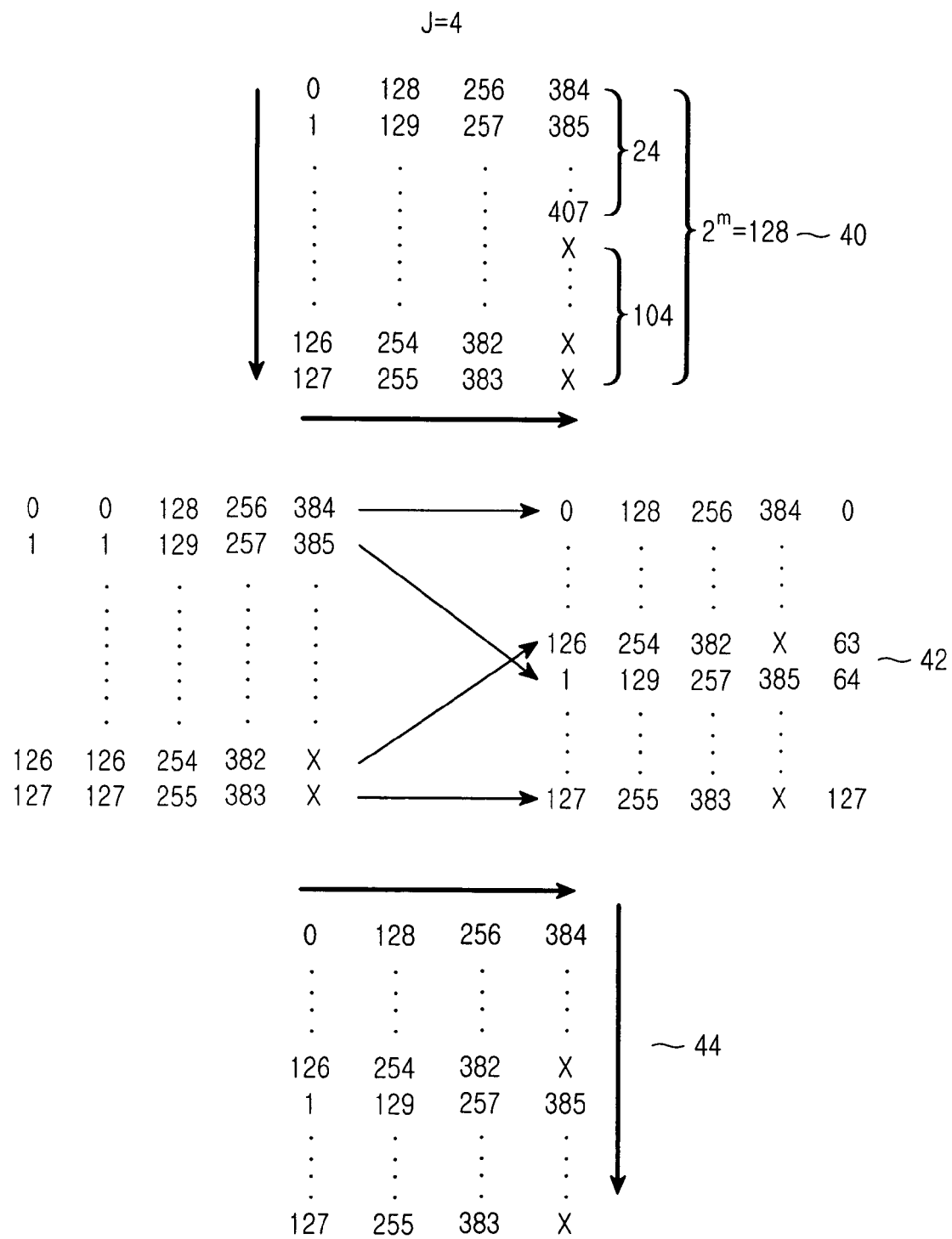
FIG. 4 illustrates an interleaving process performed on one subblock for $N_{EP}$=408, wherein the interleaving process is divided into three steps.

FIG. 4 illustrates an interleaving process performed on one subblock for $N_{EP}$=408, wherein the interleaving process is divided into three steps.

As illustrated, in step 40, 408 code symbols are sequentially written in a buffer according to an output code symbol index k (k=0,1,2, . . . , 407) of a channel decoder. Here, arrows represent the order in which code symbols are written (down→left), and the code symbols are written in order of column→row, as illustrated. That is, code symbols in a first column are written in a row direction, code symbols in second and third columns are written in the same method, and finally, remaining code symbols in a fourth column are written. In step 42, the written code symbols are rearranged for each column by bit reversal order (BRO) of a column number. Here, "bit reversal order" refers to reversing order of bits. For example, in FIG. 4, a row number "1" is expressed as "0000001" in binary. This is because the number of elements that can be included in each column is 128 since an encoder packet size is 408 and an up-limit value is set to 4. That is, in order to express 128, 7 binary digits are needed. Therefore, a row number "1" is expressed as "0000001," and the row number "1" is BRO-reversed into "1000000." This can be expressed as a row number "64" in decimal. In the present invention, such a read address is generated. In step 44, the rearranged code symbols are output from a buffer in order of row→column by row BRO according to the generated read address. Here, arrows represent the order in which code symbols are written (right→down).

Referring to FIG. 4, a matrix of code symbols written in a buffer consists of $2^7$ rows and 4 columns, and the last $4^{th}$ column has only 24 elements. Here, if the $4^{th}$ column has no element, i.e., if R=0, subblock interleaving in a base station transmitter can be achieved by simply generating a read address $B_i$ of an $i^{th}$ code symbol (where i=0, 1, 2, . . . , 407) in accordance with Equation (2) and then reading a code symbol in a corresponding address from a buffer.

$$B_i = 2^m \times (i \bmod (J-1)) + BRO_m(\lfloor i/(J-1) \rfloor) \qquad (2)$$

$$= 2^7 \times (i \bmod 3) + BRO_7(\lfloor i/3 \rfloor)$$

In Equation (2), "i" is an output code symbol index of a subblock interleaver, "mod" indicates a modulo operation, "$BRO_7(\bullet)$" indicates a 7-bit BRO operation, and "$\lfloor \bullet \rfloor$" indicates a maximum integer not exceeding an input "$\bullet$".

Meanwhile, code symbols interleaved in a base station are transmitted to a mobile station through a well known procedure such as modulation and spreading. The code symbols received at the mobile station are written in an input buffer of a channel decoder in subblock-interleaved order. Therefore, the subblock interleaving can be achieved by generating a read address $A_k$ of a $k^{th}$ code symbol for an input code symbol index k (k=0,1,2, ... , 407) of the channel decoder in accordance with an inverse function of Equation (2) above, and reading a code symbol in a corresponding address from the channel decoder. Equation (3) below shows a generation expression of a read address $A_k$ using an inverse function of $B_i$ given by Equation (2).

$$A_k = (J-1) \times BRO_m(k \bmod 2^m) + \lfloor k/2^m \rfloor \quad (3)$$
$$= 3 \times BRO_7(k \bmod 2^7) + \lfloor k/2^7 \rfloor$$

Equation (2) and Equation (3) were considered for R=0. However, since R has non-zero values for all encoder packet sizes specified in Table 1 including $N_{EP}$=408, a read address generation expression for subblock interleaving is not as simple as Equation (3).

Therefore, the embodiment of the present invention separates a generation process of a read address for an input buffer of a channel decoder into three steps of interim address generation, address compensation and addition. Here, an "interim address" indicates a read address generated on the assumption that R=0, and the "address compensation" indicates an operation of generating an address compensation factor for generating a final read address by compensating the interim address.

Figure 5:
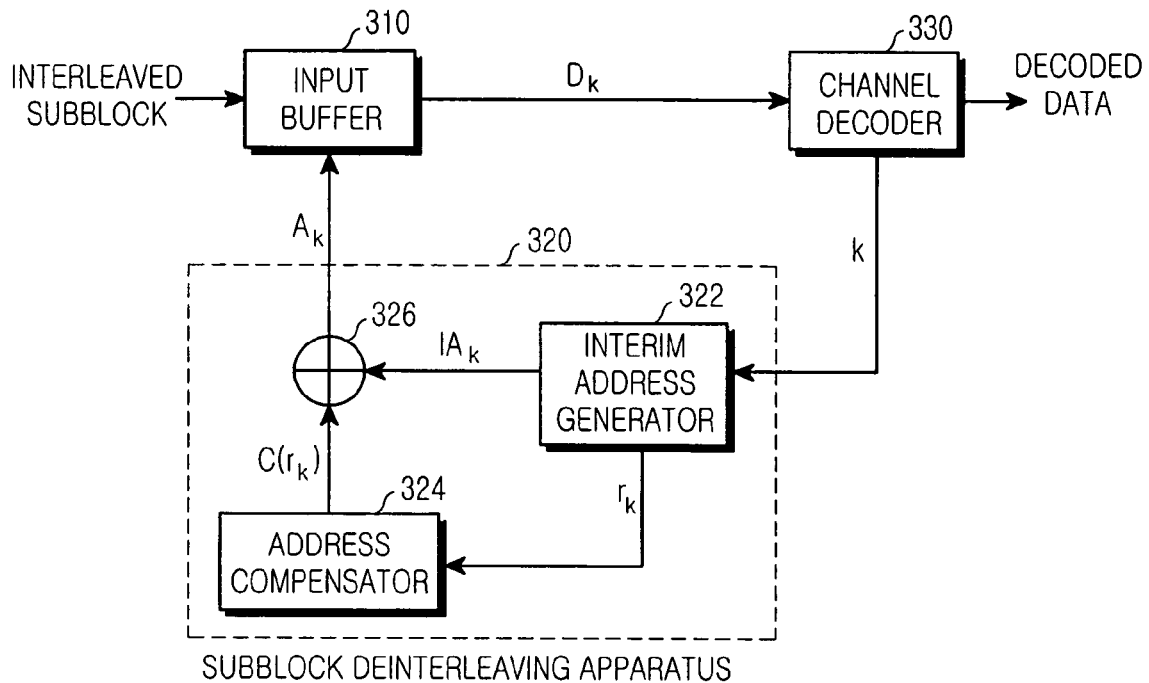
FIG. 5 is a block diagram illustrating an apparatus for performing subblock deinterleaving on forward packet data traffic according to an embodiment of the present invention.

FIG. 5 illustrates an apparatus for performing subblock deinterleaving on forward packet data traffic according to an embodiment of the present invention. The illustrated apparatus performs subblock deinterleaving on each of interleaved subblocks output from the subblock symbol ungrouper 222 in the mobile station receiver of FIG. 3.

Referring to FIG. 5, interleaved code symbols of one subblock are written in an input buffer 310 for a channel decoder 330 in interleaved order. Here, a memory structure of the input buffer 310 is formed in a $2^m \times J$ memory array according to an encoder packet size $N_{EP}$, and code symbols are written in the memory array in order of column→row as described in step 40 of FIG. 4. A deinterleaving address generator 320 then generates read address for reading code symbols from the input buffer 310 according to a deinterleaving rule corresponding to the interleaving rule used in the base station transmitter.

Equation (4) below illustrates a generation expression for generating a read address in the deinterleaving address generator 320.

$$A_k = IA_k + C(r_k) \quad (4)$$

Here, "k" is an index of a code symbol that the channel decoder 330 requested, "$A_k$" is a read address of an input buffer 310 in which subblock interleaving was reflected, "$IA_k$" is an interim address, "$C(r_k)$" is an address compensation factor for the interim address, and "$r_k$" is a row index of an interleaved code symbol matrix.

More specifically, an interim address generator 322 receives a code symbol index k from the channel decoder 330, and generates an interim address $IA_k$ for which the last column was not considered and a row index $r_k$ for the k. An address compensator 324 receives the row index $r_k$ and generates an address compensation factor $C(r_k)$ for a corresponding row, and an adder 326 adds the address compensation factor $C(r_k)$ of a corresponding row to the interim address $IA_k$ and provides a final read address $A_k$ to the input buffer 310.

The input buffer 310 then outputs a code symbol corresponding to the read address $A_k$ to the channel decoder 330. A series of such procedures are continued until all code symbols written in the input buffer 310 are read out.

Generation of an interim address by the interim address generator 322 will now be described in more detail. In FIG. 5, the interim address generator 322 receives an index k of a code symbol that the channel decoder 330 desires to receive, and outputs an interim address $IA_k$ and a corresponding row index $r_k$. Assuming that a memory array of the input buffer 310 for writing interleaved code symbols of one subblock has the format of a matrix shown in step 44 of FIG. 4, a row index $r_k$ of a $k^{th}$ code symbol can be simply calculated by $$r_k = BRO_m(k \bmod 2^m) \quad (5)$$

where "m" indicates a bit shift value shown in Table 1.

As mentioned above, the interim address is an interim read address generated on the assumption that a remainder R in Table 1 is equal to 0 or a total number ($=2^m$) of rows. In this case, interleaved code symbols written in the input buffer 310 constitute a perfect $2^m \times (J-1)$ or $2^m \times J$ matrix.

According to Table 1, for 5 kinds of encoder packets with $N_{EP} \leq 3096$, R is smaller than $2^{m-1}$ which is a half of the total number of rows, whereas for encoder packets with $N_{EP}$=3864, R is larger than $2^{m-1}$. When R is smaller than a half of the number of rows, if a $2^m \times (J-1)$ matrix is used, only R elements can be further considered during address compensation. In contrast, when R is larger than a half of the number of rows, if a $2^m \times J$ matrix is used, only ($2^m - R$) elements are excluded during address compensation. Therefore, an interim address generation expression for more simplifying an operation of the address compensator 324 is divided into two types according to a value of the remainder R as shown in Equation (6) below.

$$\text{if } R < 2^{m-1} \quad (6)$$
$$IA_k = (J-1) \cdot BRO_m(k \bmod 2^m) + \lfloor k/2^m \rfloor$$
$$= (J-1) \cdot r_k + \lfloor k/2^m \rfloor$$
otherwise
$$IA_k = J \cdot BRO_m(k \bmod 2^m) + \lfloor k/2^m \rfloor$$
$$= J \cdot r_k + \lfloor k/2^m \rfloor$$

Next, address compensation by the address compensator 324 will be described in more detail. The address compensator 324 receives a row index $r_k$ from the interim address generator 322 and outputs an address compensation factor $C(r_k)$. As mentioned above, if the remainder R by an encoder packet size is smaller than a half, $2^{m-1}$, of the number of rows, an address compensation factor is increased by one each time there occurs an element that must be further considered. On the contrary, if the remainder R is larger than a half of the number of rows, an address compensation factor is decreased by one each time an element to be excluded is generated.

A principle of generating the address compensation factor will now be described with reference to the following two examples.

EXAMPLE 1

NEP=20, m=4, J=2 and R=4

In Example 1, the remainder R is smaller than 8 ($=2^{m-1}$) which is a half of the number of rows.

FIG. 6 illustrates a matrix of code symbols formed by applying an encoder packet size and interleaving parameters given in Example 1. As illustrated, a first column has all of 16 elements, but a second column has only 4 elements.

In a matrix before a row BRO operation, code symbols of the last column are located in row indexes 0, 1, 2 and 3, but code symbols of the last column after a row BRO operation are uniformly dispersed while maintaining the same distance 4 (=16/4), thereby shifting to respective row indexes 0, 4, 8 and 12. Such dispersion appears because of a characteristic of the BRO operation, and it can be understood that if such a characteristic is used, an address compensation factor for $R<2^{m-1}$ is increased by one at every $4^{th}$ row after a code symbol first appears at the last column.

FIG. 7 sequentially illustrates a row index $r_k$, an interim address $IA_k$, an address compensation factor $C(r_k)$, and a final read address $A_k$, generated for a code symbol index k in Example 1. As illustrated, a final read address $A_k$ is a value determined by adding an address compensation factor $C(r_k)$ to an interim address $IA_k$, and the address compensation factor $C(r_k)$ is increased by one at the next rows each time a code symbol appears at the last column because if a code symbol to be further considered for the last column which was not considered during generation of an interim address is inserted, a read address for the inserted code symbol is additionally allocated and as a result, its succeeding interim addresses must be shifted forward by one.

That is, the address compensator factor $C(r_k)$ can be calculated by determining a row of the matrix, to which a code symbol, written in the input buffer 310, having an index k requested by the channel encoder 330 belongs, and determining the number of rows in which code symbols that were not considered during generation of an interim address before a row to which the corresponding code symbol belongs are inserted.

For example, since a row index of a code symbol with a code symbol index k=10 is 5 and the number of rows in which code symbols that were not considered during generation of an interim address before this row are inserted is 2 (row index=0,4), an address compensation factor for the code symbol index 10 becomes 2. A process of calculating the address compensation factor is defined as $$C_d^+(r_k) = \left\lfloor \frac{r_k + d - (r^+ + 1)}{d} \right\rfloor \quad (7)$$

Here, "d" is a value determined by dividing the total number of rows by the number of code symbols to be inserted, or the number of rows in which code symbols are to be inserted, and it means an inter-row distance of code symbols belonging to the last column. Further, "$r^+$" means an index of a row where a first inserted code symbol among the remaining code symbols inserted in the last column is located. Since a code symbol first inserted in the last column is always located in a row index 0 in the light of a characteristic of a BRO operation, $r^+$ is 0. However, when there exists a code symbol that was already inserted in the last column according to the remainder R and the number of rows, a row index $r^+$ of a first code symbol additionally inserted according to the row index of the already inserted code symbol is determined. In an address compensation factor $C_d^+$ of Equation (7), "+" is for indicating that a code symbol is "inserted" in the last column, and "d" is for indicating a ratio of the number of rows in which code symbols are inserted to the total number of rows.

If Equation (7) is applied to Example 1, an address compensation factor generation expression for Example 1 is given by $$C_4^+(r_k) = \left\lfloor \frac{r_k + 4 - (0 + 1)}{4} \right\rfloor = \left\lfloor \frac{r_k + 3}{4} \right\rfloor \quad (8)$$

EXAMPLE 2

NEP=20, m=4, J=2 and R=12

In Example 2, the remainder R is larger than equal to 8 ($=2^{m-1}$) which is a half of the number of rows.

FIG. 8 illustrates a matrix of code symbols formed by applying an encoder packet size and interleaving parameters given in Example 2. As illustrated, a first column has all of 16 elements, but 4 elements must be excluded from a second column.

In a matrix before a row BRO operation, code symbols to be excluded from the last column are located in row indexes 12, 13, 14 and 15, but code symbols to be excluded after a row BRO operation are dispersed while maintaining the same inter-row distance 4 (=16/4), thereby shifting to respective row indexes 3, 7, 11 and 15. Such dispersion appears because of a characteristic of the BRO operation, and it can be understood that if such a characteristic is used, an address compensation factor for $R \geq 2^{m-1}$ is decreased by one at every $4^{th}$ row after a code symbol is first excluded from the last column.

FIG. 9 sequentially illustrates a row index $r_k$, an interim address $IA_k$, an address compensation factor $C(r_k)$, and a final read address $A_k$, generated for a code symbol index k in Example 2. As illustrated, a final read address $A_k$ is a value determined by adding a negative address compensation factor $C(r_k)$ to an interim address $IA_k$, and the address compensation factor $C(r_k)$ is decreased by one at the next rows each time a code symbol is excluded from the last column. This is because if a code symbol that should have not been considered which was considered during generation of an interim address is inserted, a read address which was allocated for the excluded code symbol must be deallocated and as a result, its succeeding interim addresses must be shifted backward by one.

That is, the address compensator factor $C(r_k)$ can be calculated by determining a row of the matrix, to which a code symbol, written in the input buffer 310, having an index k requested by the channel encoder 330 belongs, and determining the number of rows in which code symbols that were considered during generation of an interim address before a row to which the corresponding code symbol belongs are inserted.

For example, since a row index of a code symbol with a code symbol index k=13 requested by the channel decoder 330 of FIG. 5 is 11 and the number of rows from which code symbols that were considered during generation of an interim address this row are excluded is 2 (row index=3,7), an address compensation factor for the code symbol index 13 becomes −2. A process of calculating the address compensation factor is defined as $$C_d^-(r_k) = -\left\lfloor \frac{r_k + d - (r^- + 1)}{d} \right\rfloor \quad (9)$$

Here, "d" is a value determined by dividing the total number of rows by the number of code symbols to be excluded, or the number of rows from which code symbols are to be excluded, and it means an inter-row distance of code symbols to be excluded from the last column. Further, "$r^-$" means an index of a row where a first excluded code symbol is located. Since a code symbol first excluded from the last column is always located in a row index d−1 in the light of a characteristic of a BRO operation, $r^-$ is d−1. However, when there exists a code symbol that was already excluded in a state where the last column is not fully filled according to the remainder R and the number of rows, a row index $r^-$ of a first code symbol additionally excluded according to the row index of the previously excluded code symbol is determined. In an address compensation factor $C_d^-$ of Equation (9), "−" is for indicating that a code symbol is "excluded" from the last column, and "d" is for indicating a ratio of the number of rows from which code symbols are excluded to the total number of rows.

If Equation (9) is applied to Example 2, an address compensation factor generation expression for Example 2 is given by $$C_4^-(r_k) = -\left\lfloor \frac{r_k + 4 - (3+1)}{4} \right\rfloor = -\left\lfloor \frac{r_k}{4} \right\rfloor \quad (10)$$

With reference to Example 1 and Example 2, a procedure for calculating an address compensation factor has been described separately for the case where code symbols are inserted and the case where virtual code symbols are excluded. Here, a ratio d of the number of rows into/from which code symbols are inserted or excluded to the total number of rows represents a distance between rows to which code symbols to be inserted or code symbols to be excluded belong, and this is defined as:

$$d = \frac{\text{\# of total rows}}{\text{\# of rows to be considered}}, \quad (11)$$

where $d$ has to be a natural number

Here, if the "d" is not a natural number, the address compensation factor generation expressions using a characteristic of the BRO operation, described in conjunction with Example 1 and Example 2, become incorrect. In Equation (11), since the number of total rows, which is a numerator, is always a power of 2, the number of insertion or exclusion rows, which is a denominator, should also become a power of 2, in order for the d to become a natural number. In Table 1, the remainder R represents the number of rows into/from which code symbols must be inserted or excluded, and for all encoder packet sizes, none of the remainders R is a power of 2. However, even in this case, if R is expressed as the sum of powers of 2, Equation (7) and Equation (9) can be applied.

Now, a description will be made of a generation principle of an address compensation factor to be actually applied to each of the encoder packet sizes $N_{EP}$=408, 792, 1560, 2328, 3096, 3864, 6168 and 12312.

A. Generation of Address Compensation Factor for $N_{EP}$=408, 792, 1560, 3096, 6168 and 12312 (R=24)

First, a description of a method for generating an address compression factor will be made as to an encoder packet size $N_{EP}$=408. Here, interleaved code symbols are read from the matrix shown in step 44 of FIG. 4 in order of row → column and then written in an input buffer of a channel decoder.

408 code symbols included in one subblock constitute a matrix having 128 (=$2^7$) rows, and the last column of this matrix has 24 code symbols that were not considered during generation of an interim address. Since 24 can be expressed as $2^4+2^3$ in the form of a power of 2, the 24 code symbols will be separated into 16 higher code symbols and 8 lower code symbols.

That is, the 16 higher code symbols are arranged in $0^{th}$, $8^{th}$, $16^{th}$, $104^{th}$, $112^{th}$, and $120^{th}$ rows being spaced apart by a predetermined inter-row distance 8 (=128/16) beginning at the uppermost row, and the remaining 8 lower code symbols are arranged in $4^{th}$, $20^{th}$, $36^{th}$, ..., $84^{th}$, $100^{th}$, and $116^{th}$ rows being spaced apart by a predetermined inter-row distance 16 (=128/8) beginning at a $4^{th}$ (=8/2) row.

Of the 24 code symbols, 16 code symbols are periodically inserted each time a row index becomes a multiple of 8, and the remaining 8 code symbols are periodically inserted each time a row index becomes a multiple of 16, so it can be considered that the 24 code symbols are identical in their insertion patterns at periods of 16. Therefore, it can be interpreted that inserting 24 code symbols in 128 rows is equivalent to inserting 3 (=24/8) code symbols every 16 (=128/8) rows.

The number 3 of the code symbols to be inserted can be expressed as 3=2+1 or 3=4−1 in the form of a power of 2. For these two cases, an address compensation factor can be calculated as follows.

When 3 is expressed as 2+1, 2 code symbols are first inserted into 16 rows and then one code symbol must be further inserted. In this case, d is 8 (=16/2) during first insertion, and d is 16 (=16/1) during second insertion. Thus, an address compensation factor $C(r_k)$ is calculated by $$C(r_k) = C_8^+(r_k) + C_{16}^+(r_k) \quad (12)$$
$$= \left\lfloor \frac{r_k + 8 - (0+1)}{8} \right\rfloor + \left\lfloor \frac{r_k + 16 - (4+1)}{16} \right\rfloor$$
$$= \left\lfloor \frac{r_k + 7}{8} \right\rfloor + \left\lfloor \frac{r_k + 11}{8} \right\rfloor$$

In Equation (12), for d=8, 2 code symbols with an inter-row distance 8 are first inserted in the last column in a state where the last column of a matrix has no code symbol, so a row index of a first inserted code symbol is 0. Therefore, at this point, $r^+$ is 0. In addition, for d=16, one code symbol is additionally inserted in a state where the last column of the matrix already has 2 code symbols with an inter-row distance 8. In this case, the added code symbol is inserted between already inserted 2 code symbols in the light of a characteristic of a BRO operation. Therefore, at this point, $r^+$ becomes 4 (=(0+8)/2).

Next, when 3 is expressed as 4−1, 4 code symbols are first inserted in 16 rows and then one of the inserted code symbols is excluded. In this case, d is 4 (=16/4) during insertion, and d is 16 (=16/1) during exclusion. Thus, an address compensation factor $C(r_k)$ is calculated by $$C(r_k) = C_4^+(r_k) + C_{16}^-(r_k) \quad (13)$$

$$= \left\lfloor \frac{r_k + 4 - (0+1)}{4} \right\rfloor - \left\lfloor \frac{r_k + 16 - (12+1)}{16} \right\rfloor$$

$$= \left\lfloor \frac{r_k + 3}{4} \right\rfloor - \left\lfloor \frac{r_k + 3}{8} \right\rfloor$$

In Equation (13), for d=4, a row index $r^+$ of a code symbol first inserted in the last column of the matrix is 0, and for d=16, a row index $r^-$ of a code symbol first excluded from the last column is 12. This is because in the light of a characteristic of a BRO operation, a code symbol in the last row among 4 code symbols that were already inserted in the last column must be first excluded. That is, since the number of code symbols that were already inserted in the last column is 4 and their inter-row distance is 4, an index $r^-$ of the last row is 12(=0+3×4).

Equation (12) is completely equal to Equation (13) in operation result. In implementing the address compensator 324 by hardware, Equation (13) that requires only one adder for adding 3 to $r_k$ is more efficient than Equation (12) which requires two adders for adding different values 7 and 11 to $r_k$, in terms of implementation complexity.

In the cases where an encoder packet size $N_{EP}$ is 792, 1560, 3096, 6168 and 12312, the number of rows constituting the matrix is increased 2, 4, 8, 16 and 32 times, respectively, compared with when an encoder packet size $N_{EP}$ is 408, but the number of code symbols that were not considered during generation of an interim address is equally 24 for all the cases. Therefore, in those cases, an address compensation factor can be calculated using a generation expression generalized so as to have a bit shift value m as a parameter using Equation (13). Equation (14) below illustrates an address compensation factor generation expression applied for $N_{EP}$=408, 792, 1560, 3096, 6168, and 12312, and as shown in Table 1, for the encoder packet sizes, m is 7, 8, 9, 10, 11, and 12, respectively.

$$C(r_r) = C_{2^{m-5}}^+(r_k) + C_{2^{m-3}}^-(r_k) \quad (14)$$

$$= \left\lfloor \frac{r_k + 2^{m-5} - (0+1)}{2^{m-5}} \right\rfloor - \left\lfloor \frac{r_k + 2^{m-3} - (3 \cdot 2^{m-3}+1)}{2^{m-3}} \right\rfloor$$

$$= \left\lfloor \frac{r_k + 2^{m-5} - 1}{2^{m-5}} \right\rfloor - \left\lfloor \frac{r_k + 2^{m-5} - 1}{2^{m-3}} \right\rfloor$$

Here, a code symbol index k is k=0, 1, ..., $N_{EP}$−1, and a row index $r_k$ is $r_k$=0, 1, ..., $2^m$−1.

B. Generation of Address Compensation Factor for $N_{EP}$=2328 (R=280)

When an encoder packet size is 2328, 2328 code symbols included in one subblock constitute a matrix having 1024 (=$2^{10}$) rows, and the last column of this matrix has 280 code symbols that were not considered during generation of an interim address. Since 280 can be expressed as $2^8+2^4+2^3$ in the form of a power of 2, the 280 code symbols will be separated into 256 higher code symbols, the next 16 code symbols, and the remaining 8 code symbols.

That is, the 256 higher code symbols are periodically inserted each time a row index becomes a multiple of 4 (=1024/256), the next 16 code symbols are periodically inserted each time a row index becomes 64 (=1024/16), and the remaining 8 code symbols are periodically inserted each time a row index becomes a multiple of 128 (=1024/8). Thus, it can be considered that the 280 code symbols are identical in their insertion patterns at periods of a row index 128. Therefore, it can be interpreted that inserting 280 code symbols in 1024 rows is equivalent to inserting 35 (=280/8) code symbols every 128 (=1024/8) rows.

The number 35 of the code symbols to be inserted can be expressed as 35=32+2+1 or 35=32+4−1 in the form of a power of 2. For these two cases, an address compensation factor can be calculated separately. However, as mentioned above for the case where R=24, when 35 is expressed as 32+2+1, one more adder is required in implementing an address compensator. Therefore, a generation principle of an address compensation factor will be described only for the case where 35 is expressed as 32+4−1.

When 35 is expressed as 32+4−1, 32 code symbols are first inserted in 128 rows, 4 code symbols are further inserted, and then one of the inserted code symbols is excluded. In this case, d is 4 (=128/32) during first insertion, d is 32 (=128/4) during second insertion, and d is 128 (=128/1) during exclusion.

For d=4, 32 code symbols with an inter-row distance 4 are first inserted in the last column in a state where the last column of a matrix has no code symbol, so a row index of a first inserted code symbol is 0. Therefore, at this point, $r^+$ is 0. For d=32, 4 code symbols are additionally inserted in a state where the last column of the matrix already has 32 code symbols with an inter-row distance 4. In this case, a first inserted code symbol is inserted between first two code symbols among the already inserted 32 code symbols in the light of a characteristic of a BRO operation. Therefore, at this point, $r^+$ becomes 2 (=(0+4)/2). Finally, for d=128, one code symbol with a highest row index among the already inserted code symbols must be excluded. In this case, the excluded code symbol becomes a code symbol in the last row among the secondly inserted 4 code symbols in the light of a characteristic of a BRO operation, so $r^-$ becomes 98 (=2+3×32).

As a result, using Equation (7) and Equation (9), an address compensation factor generation expressing applied for $N_{EP}$=2328 is defined as $$C(r_k) = C_4^+(r_k) + C_{32}^+(r_k) + C_{128}^-(r_k) \quad (15)$$

$$= \left\lfloor \frac{r_k + 4 - (0+1)}{4} \right\rfloor + \left\lfloor \frac{r_k + 32 - (2+1)}{32} \right\rfloor -$$

$$\left\lfloor \frac{r_k + 128 - (98+1)}{128} \right\rfloor$$

$$= \left\lfloor \frac{r_k + 3}{4} \right\rfloor + \left\lfloor \frac{r_k + 29}{32} \right\rfloor - \left\lfloor \frac{r_k + 29}{128} \right\rfloor$$

C. Generation of Address Compensation Factor for $N_{EP}$=3864 (R=1816)

When an encoder packet size is 3864, 3864 code symbols included in one subblock constitute a matrix having 2048 (=$2^{11}$) rows, and 232 (=2048−1816) code symbols that were considered together during generation of an interim address must be excluded from the last column of this matrix. Since 232 can be expressed as $2^7+2^6+2^5+2^3$ in the form of a power of 2, the 232 code symbols will be separated into 128 code symbols, 64 code symbols, 32 code symbols, and 8 code symbols.

That is, of the 232 code symbols, the last 8 code symbols are periodically excluded each time a row index becomes a multiple of 256 (=2048/8), so the 232 code symbols are identical in their exclusion patterns at periods of 256. Therefore, it can be interpreted that excluding 232 code symbols from 2048 rows is equivalent to excluding 29 (=232/8) code symbols every 256 rows.

The number 29 of the code symbols to be excluded can be expressed as −29=−16−8−4−1 or −29=−32+4−1 in the form of a power of 2. For these two cases, an address compensation factor can be calculated separately. However, if −29 is expressed as −16−8−4−1, several adders are further required in implementing an address compensator. Therefore, a generation principle of an address compensation factor will be described only for the case where −29 is expressed as −32+4−1.

When −29 is expressed as −32+4−1, 32 code symbols are first excluded, next, 4 code symbols are inserted, and then one code symbol is excluded. In this case, d is 8 (=256/32) during first exclusion, d is 64 (=256/4) during insertion, and d is 256 (=256/1) during second exclusion.

For d=8, 32 code symbols with an inter-row distance 8 are first excluded from the last column in a state where the last column of a matrix is fully filled with code symbols, so a row index of a first excluded code symbol is d−1 in the light of a characteristic of a BRO operation. Therefore, at this point, $r^-$ is 7 (=8−1). In addition, for d=64, 4 code symbols with an inter-row distance 64 among the excluded 32 code symbols are restored. In this case, a first restored code symbol is a code symbol with the lowest row index among the excluded 32 code symbols in the light of a characteristic of a BRO operation. Therefore, at this point also, $r^+$ becomes 7 (=8−1). Finally, for d=256, one code symbol with a highest row index among the restored 4 code symbols is excluded again, so $r^-$ becomes 199 (=7+3×64).

As a result, using Equation (7) and Equation (9), an address compensation factor generation expressing applied for $N_{EP}$=3864 is defined as $$C(r_k) = C_8^-(r_k) + C_{64}^+(r_k) + C_{256}^-(r_k) \quad (16)$$

$$= -\left\lfloor \frac{r_k + 8 - (7+1)}{8} \right\rfloor + \left\lfloor \frac{r_k + 64 - (7+1)}{64} \right\rfloor - \left\lfloor \frac{r_k + 256 - (199+1)}{256} \right\rfloor$$

$$= -\left\lfloor \frac{r_k}{8} \right\rfloor + \left\lfloor \frac{r_k + 56}{64} \right\rfloor - \left\lfloor \frac{r_k + 56}{256} \right\rfloor$$

D. Generation of Address Compensation Factor for $N_{EP}$=4632 (R=536)

When an encoder packet size is 4632, 4632 code symbols included in one subblock constitute a matrix having 2048 (=$2^{11}$) rows, and the last column of this matrix has 536 code symbols that were not considered during generation of an interim address. Since 536 can be expressed as $2^9+2^4+2^3$ in the form of a power of 2, the 536 code symbols will be separated into 512 higher code symbols, the next 16 code symbols, the remaining 8 code symbols.

That is, the 512 higher code symbols are periodically inserted each time a row index becomes a multiple of 4 (=2048/512), the next 16 code symbols are periodically inserted each time a row index becomes a multiple of 128 (2048/16), and the remaining 8 code symbols are periodically inserted each time a row index becomes a multiple of 256 (2048/8), so it can be considered that the 536 code symbols are identical in their insertion patterns at periods of a row index 256. Therefore, it can be interpreted that inserting 536 code symbols in 2048 rows is equivalent to inserting 67 (=536/8) code symbols every 256 (2048/8) rows.

The number 67 of the code symbols to be inserted can be expressed as 67=64+2+1 or 67=64+4−1 in the form of a power of 2. For these two cases, an address compensation factor can be calculated separately. However, as mentioned above for the case where R=24, when 67 is expressed as 64+2+1, one more adder is required in implementing an address compensator. Therefore, a generation principle of an address compensation factor will be described only for the case where 67 is expressed as 64+4−1.

When 67 is expressed as 64+4−1, 64 code symbols are first inserted in 256 rows, 4 code symbols are further inserted, and then one of the inserted code symbols is excluded. In this case, d is 4 (=256/64) during first insertion, d is 64 (=256/4) during second insertion, and d is 256 (=256/1) during exclusion.

For d=4, 64 code symbols with an inter-row distance 4 are first inserted in the last column in a state where the last column of a matrix has no code symbol, so a row index of a first inserted code symbol is 0. Therefore, at this point, $r^+$ is 0. For d=64, 4 code symbols are additionally inserted in a state where the last column of the matrix already has 64 code symbols with an inter-row distance 4. In this case, a first inserted code symbol is inserted between first two code symbols among the already inserted 64 code symbols in the light of a characteristic of a BRO operation. Therefore, at this point, $r^+$ becomes 2 (=(0+4)/2). Finally, for d=256, one code symbol with a highest row index among the already inserted code symbols must be excluded. In this case, the excluded code symbol becomes a code symbol in the last row among the secondly inserted 4 code symbols in the light of a characteristic of a BRO operation, so $r^-$ becomes 194 (=2+3×64).

As a result, using Equation (7) and Equation (9), an address compensation factor generation expressing applied for $N_{EP}$=4632 is defined as $$C(r_k) = C_4^+(r_k) + C_{64}^+(r_k) + C_{256}^-(r_k) \quad (17)$$

$$= \left\lfloor \frac{r_k + 4 - (0+1)}{4} \right\rfloor + \left\lfloor \frac{r_k + 64 - (2+1)}{64} \right\rfloor - \left\lfloor \frac{r_k + 256 - (194+1)}{256} \right\rfloor$$

$$= \left\lfloor \frac{r_k + 3}{4} \right\rfloor + \left\lfloor \frac{r_k + 6}{64} \right\rfloor - \left\lfloor \frac{r_k + 61}{256} \right\rfloor$$

E. Generation of Address Compensation Factor for $N_{EP}$=9240 (R=1048)

When an encoder packet size is 9240, 9240 code symbols included in one subblock constitute a matrix having 4096 (=$2^{12}$) rows, and the last column of this matrix has 1048 code symbols that were not considered during generation of an interim address. Since 1048 can be expressed as $2^{10}+2^4+2^3$ in the form of a power of 2, the 1048 code symbols will be separated into 1024 higher code symbols, the next 16 code symbols, the remaining 8 code symbols.

That is, the 1024 higher code symbols are periodically inserted each time a row index becomes a multiple of 4 (=4096/1024), the next 16 code symbols are periodically inserted each time a row index becomes a multiple of 256 (4096/16), and the remaining 8 code symbols are periodically inserted each time a row index becomes a multiple of 512 (4096/8), so it can be considered that the 1048 code symbols are identical in their insertion patterns at periods of a row index 512. Therefore, it can be interpreted that inserting 1048 code symbols in 4096 rows is equivalent to inserting 131 (=1048/8) code symbols every 512 (4096/8) rows.

The number 131 of the code symbols to be inserted can be expressed as 131=128+2+1 or 131=128+4−1 in the form of a power of 2. For these two cases, an address compensation factor can be calculated separately. However, as mentioned above for the case where R=24, when 131 is expressed as 128+2+1, one more adder is required in implementing an address compensator. Therefore, a generation principle of an address compensation factor will be described only for the case where 131 is expressed as 128+4−1.

When 131 is expressed as 128+4−1, 128 code symbols are first inserted in 512 rows, 4 code symbols are further inserted, and then one of the inserted code symbols is excluded. In this case, d is 4 (=512/128) during first insertion, d is 128 (=512/4) during second insertion, and d is 512 (=512/1) during exclusion.

For d=4, 128 code symbols with an inter-row distance 4 are first inserted in the last column in a state where the last column of a matrix has no code symbol, so a row index of a first inserted code symbol is 0. Therefore, at this point, $r^+$ is 0. For d=128, 4 code symbols are additionally inserted in a state where the last column of the matrix already has 128 code symbols with an inter-row distance 4. In this case, a first inserted code symbol is inserted between first two code symbols among the already inserted 128 code symbols in the light of a characteristic of a BRO operation. Therefore, at this point, $r^+$ becomes 2 (=(0+4)/2). Finally, for d=512, one code symbol with a highest row index among the already inserted code symbols must be excluded. In this case, the excluded code symbol becomes a code symbol in the last row among the secondly inserted 4 code symbols in the light of a characteristic of a BRO operation, so $r^-$ becomes 386 (=2+3×128).

As a result, using Equation (7) and Equation (9), an address compensation factor generation expressing applied for $N_{EP}$=9240 is defined as $$C(r_k) = C_4^+(r_k) + C_{128}^+(r_k) + C_{512}^-(r_k) \quad (18)$$

$$= \left\lfloor \frac{r_k + 4 - (0+1)}{4} \right\rfloor + \left\lfloor \frac{r_k + 128 - (2+1)}{128} \right\rfloor - \left\lfloor \frac{r_k + 512 - (386+1)}{512} \right\rfloor$$

$$= \left\lfloor \frac{r_k + 3}{4} \right\rfloor + \left\lfloor \frac{r_k + 125}{128} \right\rfloor - \left\lfloor \frac{r_k + 125}{512} \right\rfloor$$

F. Generation of Address Compensation Factor for $N_{EP}$=15384 (R=7192)

When an encoder packet size is 15384, 15384 code symbols included in one subblock constitute a matrix having 8192 (=$2^{13}$) rows, and 1000 (=8192−7192) code symbols that were considered together during generation of an interim address must be excluded from the last column of this matrix. Since 1000 can be expressed as $2^9+2^8+2^7+2^6+2^5+2^3$ in the form of a power of 2, the 1000 code symbols will be separated into 512 code symbols, 256 code symbols, 128 code symbols, 64 code symbols, 32 code symbols, and 8 code symbols.

That is, of the 1000 code symbols, the last 8 code symbols are periodically excluded each time a row index becomes a multiple of 1024 (=8192/8), so the 1000 code symbols are identical in their exclusion patterns at periods of 1024. Therefore, it can be interpreted that excluding 1000 code symbols from 8192 rows is equivalent to excluding 125 (=1000/8) code symbols every 1024 rows.

The number 125 of the code symbols to be excluded can be expressed as −125=−64−32−16−8−4−1 or −125=−128+4−1 in the form of a power of 2. For these two cases, an address compensation factor can be calculated separately. However, if −125 is expressed as −64−32−16−8−4−1, several adders are further required in implementing an address compensator. Therefore, a generation principle of an address compensation factor will be described only for the case where −125 is expressed as −128+4−1.

When −125 is expressed as −128+4−1, 128 code symbols are first excluded, next, 4 code symbols are inserted, and then one code symbol is excluded. In this case, d is 8 (=1024/128) during first exclusion, d is 256 (=1024/4) during insertion, and d is 1024 (=1024/1) during second exclusion.

For d=8, 128 code symbols with an inter-row distance 8 are first excluded from the last column in a state where the last column of a matrix is fully filled with code symbols, so a row index of a first excluded code symbol is d−1 in the light of a characteristic of a BRO operation. Therefore, at this point, $r^-$ is 7 (=8−1). In addition, for d=256, 4 code symbols with an inter-row distance 256 among the excluded 128 code symbols are restored. In this case, a first restored code symbol is a code symbol with the lowest row index among the excluded 128 code symbols in the light of a characteristic of a BRO operation. Therefore, at this point also, $r^+$ becomes 7 (=8−1). Finally, for d=1024, one code symbol with a highest row index among the restored 4 code symbols is excluded again, so $r^-$ becomes 775 (=7+3×256).

As a result, using Equation (7) and Equation (9), an address compensation factor generation expressing applied for $N_{EP}$=15384 is defined as $$C(r_k) = C_8^-(r_k) + C_{256}^+(r_k) + C_{1024}^-(r_k) \quad (19)$$

$$= -\left\lfloor \frac{r_k + 8 - (7+1)}{8} \right\rfloor + \left\lfloor \frac{r_k + 256 - (7+1)}{256} \right\rfloor - \left\lfloor \frac{r_k + 1024 - (775+1)}{1024} \right\rfloor$$

$$= -\left\lfloor \frac{r_k}{8} \right\rfloor + \left\lfloor \frac{r_k + 248}{256} \right\rfloor - \left\lfloor \frac{r_k + 248}{1024} \right\rfloor$$

As described above, in a mobile station supporting a 1xEV-DV standard, subblock deinterleaving for forward packet data traffic is performed in such a manner that when the interim address generator 322 generates an interim address according to Equation (5) and Equation (6), the address compensator 324 generates an address compensator factor using one of Equation (14), Equation (15), Equation (16), Equation (17), Equation (18) and Equation (19), and the adder 326 generates a read address by calculating Equation (4).

That is, if Equation (6) and one of Equation (14), Equation (15), Equation (16), Equation (17), Equation (18) and Equation (19) selected according to an encoder packet size are substituted in Equation (4), then Equation (20), Equation (21), Equation (22), Equation (23), Equation (24) and Equation (25) below can be obtained. Equation (20) is a read address generation expression of the input buffer 310 for $N_{EP}$=408 (m=7), 792 (m=8), 1560 (m=9), 3096 (m=10), 6168 (m=11) and 12312 (m=12). Equation (21) is a read address generation expression of the input buffer 310 for $N_{EP}$=2328. Equation (22) is a read address generation expression of the input buffer 310 for $N_{EP}$=3864. Equation (23) is a read address generation expression of the input buffer 310 for $N_{EP}$=4632. Equation (24) is a read address generation expression of the input buffer 310 for $N_{EP}$=9240. Equation (25) is a read address generation expression of the input buffer 310 for $N_{EP}$=15384.

$$A_k = IA_k + C(r_k) \qquad (20)$$
$$= (J-1) \cdot BRO_m(k \bmod 2^m) + \lfloor k/2^m \rfloor +$$
$$\left\lfloor \frac{BRO_m(k \bmod 2^m) + 2^{m-5} - 1}{2^{m-5}} \right\rfloor -$$
$$\left\lfloor \frac{BRO_m(k \bmod 2^m) + 2^{m-5} - 1}{2^{m-3}} \right\rfloor$$

$$A_k = IA_k + C(r_k) \qquad (21)$$
$$= 2 \cdot BRO_{10}(k \bmod 2^{10}) + \left\lfloor \frac{k}{2^{10}} \right\rfloor +$$
$$\left\lfloor \frac{BRO_{10}(k \bmod 2^{10}) + 3}{4} \right\rfloor + \left\lfloor \frac{BRO_{10}(k \bmod 2^{10}) + 29}{32} \right\rfloor -$$
$$\left\lfloor \frac{BRO_{10}(k \bmod 2^{10}) + 29}{128} \right\rfloor$$

$$A_k = IA_k + C(r_k) \qquad (22)$$
$$= 2 \cdot BRO_{11}(k \bmod 2^{11}) + \left\lfloor \frac{k}{2^{11}} \right\rfloor -$$
$$\left\lfloor \frac{BRO_{11}(k \bmod 2^{11})}{8} \right\rfloor + \left\lfloor \frac{BRO_{11}(k \bmod 2^{11}) + 56}{64} \right\rfloor -$$
$$\left\lfloor \frac{BRO_{11}(k \bmod 2^{11}) + 56}{256} \right\rfloor$$

$$A_k = IA_k + C(r_k) \qquad (23)$$
$$= 2 \cdot BRO_{11}(k \bmod 2^{11}) + \left\lfloor \frac{k}{2^{11}} \right\rfloor +$$
$$\left\lfloor \frac{BRO_{11}(k \bmod 2^{11}) + 3}{4} \right\rfloor + \left\lfloor \frac{BRO_{11}(k \bmod 2^{11}) + 61}{64} \right\rfloor -$$
$$\left\lfloor \frac{BRO_{11}(k \bmod 2^{11}) + 61}{256} \right\rfloor$$

$$A_k = IA_k + C(r_k) \qquad (24)$$
$$= 2 \cdot BRO_{12}(k \bmod 2^{12}) + \left\lfloor \frac{k}{2^{12}} \right\rfloor +$$
$$\left\lfloor \frac{BRO_{12}(k \bmod 2^{12}) + 3}{4} \right\rfloor + \left\lfloor \frac{BRO_{12}(k \bmod 2^{12}) + 125}{128} \right\rfloor -$$
$$\left\lfloor \frac{BRO_{12}(k \bmod 2^{12}) + 125}{512} \right\rfloor$$

$$A_k = IA_k + C(r_k) \qquad (25)$$
$$= 2 \cdot BRO_{13}(k \bmod 2^{13}) + \left\lfloor \frac{k}{2^{13}} \right\rfloor -$$
$$\left\lfloor \frac{BRO_{13}(k \bmod 2^{13})}{8} \right\rfloor + \left\lfloor \frac{BRO_{13}(k \bmod 2^{13}) + 248}{256} \right\rfloor -$$
$$\left\lfloor \frac{BRO_{13}(k \bmod 2^{13}) + 248}{1024} \right\rfloor$$

Figure 10:
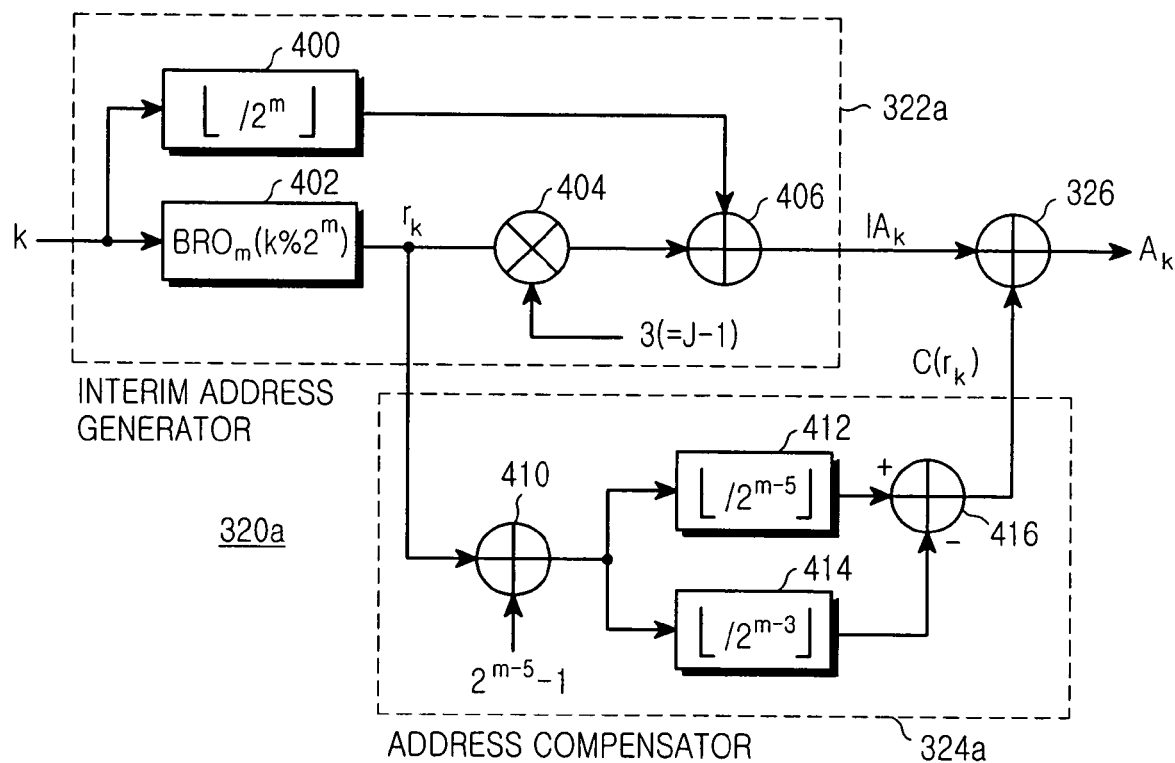
FIG. 10 illustrates a block diagram of a read address generator according to an embodiment of the present invention, for $N_{EP}$=408, 792, 1560, 3096, 6168 and 12312.

FIG. 10 illustrates a block diagram 320(a) of the deinterleaving address generator 320 generating a read address for reading code symbols written in the input buffer 310, for $N_{EP}$=408 (m=7), 792 (m=8), 1560 (m=9), 3096 (m=10), 6168 (m=11) and 12312 (m=12), and J=4. This structure is a hardware device for implementing Equation (20).

As illustrated, if a desired code symbol index k is provided from the channel decoder 330 to an interim address generator 322a, a divider 400 outputs a maximum integer not exceeding a quotient obtained by dividing the code symbol index k by $2^m$. The integer output from the divider 400 is applied to an adder 406. A BRO operator 402 groups bits obtained by dividing the code symbol index k by $2^m$, performs a BRO operation on a row index for symbols of each group by the m bits, and calculates a row index $r_k$ for the code symbol index k. That is, for 408 bits, $0^{th}$ to $127^{th}$ bits constitute a first group, $128^{th}$ to $255^{th}$ bits constitute a second group, and $256^{th}$ to $383^{rd}$ bits constitute a third group. Symbols having the same row index in each group equally undergo a BRO operation. Such grouping is equally applied to different embodiments given below. A multiplier 404 multiplies the row index $r_k$ by 3 (=J-1) and provides its output to the adder 406. The adder 406 then calculates an interim address $IA_k$ by adding an output $3r_k$ of the multiplier 404 to an output $k/2^m$ of the divider 400.

If the row index $r_k$ is applied to an address compensator 324a, an adder 410 adds $2^{m-5}-1$ to the row index $r_k$ and provides its output to dividers 412 and 414. The divider 412 outputs a maximum integer not exceeding a quotient obtained by dividing an output '$r_k+2^{m-5}-1$' of the adder 410 by $2^{m-5}$, and the divider 414 outputs a maximum integer not exceeding a quotient obtained by dividing the output '$r_k 2^{m-5}-1$' of the adder 410 by $2^{m-3}$. An adder 416 calculates an address compensation factor $C(r_k)$ by subtracting an output of the divider 414 from an output of the divider 412. An adder 326 finally calculates a read address $A_k$ by adding the address compensation factor $C(r_k)$ to the interim address $IA_k$.

Figure 11:
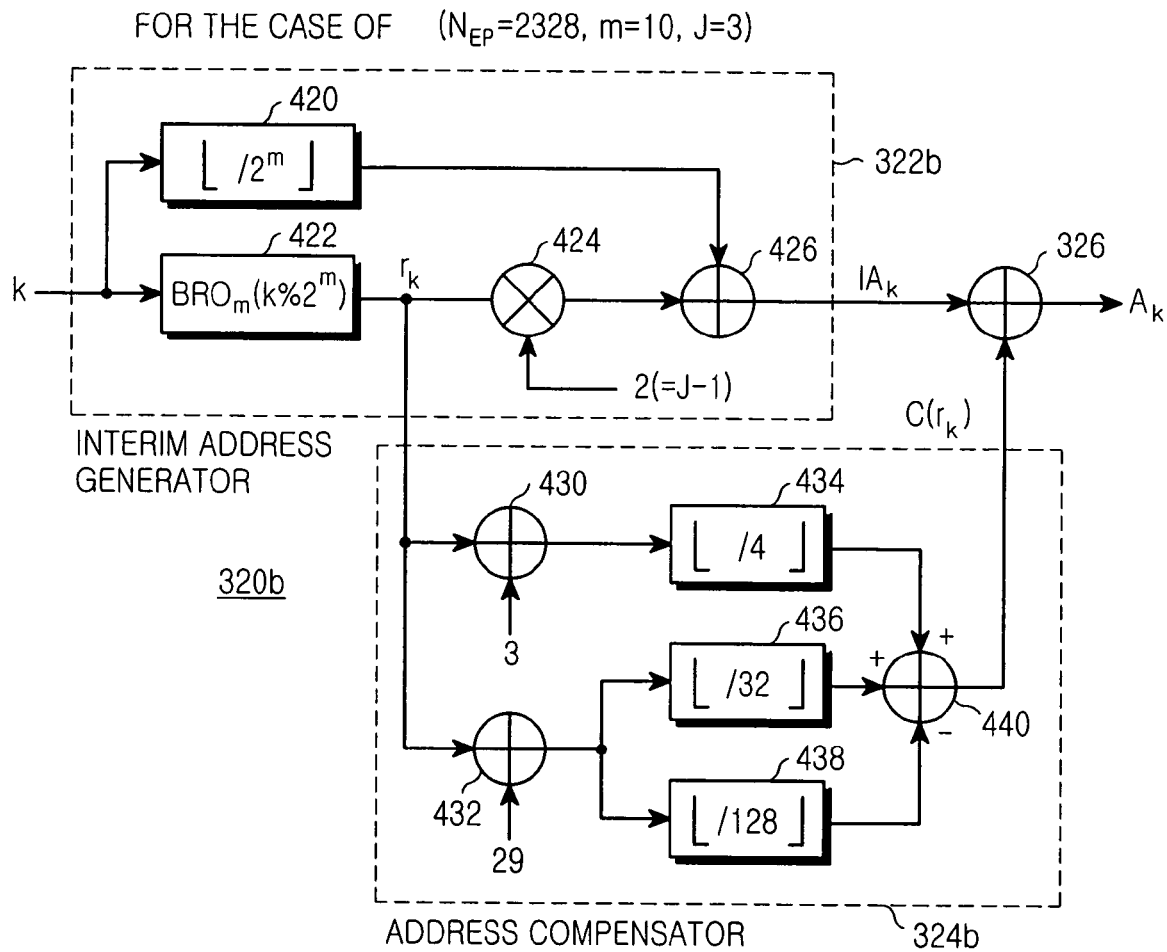
FIG. 11 illustrates a block diagram of a read address generator according to an embodiment of the present invention, for $N_{EP}$=3238.

FIG. 11 illustrates a block diagram 320b of the deinterleaving address generator 320 generating a read address for reading code symbols written in the input buffer 310, for $N_{EP}$=3238 (m=10 and J=3). This structure is a hardware device for implementing Equation (21).

As illustrated, if a desired code symbol index k is provided from the channel decoder 330 to an interim address generator 322b, a divider 420 provides an adder 426 with a maximum integer not exceeding a quotient obtained by dividing the code symbol index k by $2^m$. A BRO operator 422 groups bits obtained by dividing the code symbol index k by $2^m$, performs a BRO operation on a row index for symbols of each group by the m bits, and calculates a row index $r_k$ for the code symbol index k. A multiplier 424 multiplies the row index $r_k$ by 2 (=J-1) and provides its output to the adder 426. The adder 426 then calculates an interim address $IA_k$ by adding an output $3r_k$ of the multiplier 424 to an output $k/2^m$ of the divider 420.

If the row index $r_k$ is applied to an address compensator 324b, an adder 430 adds 3 to the row index $r_k$, and a divider 434 outputs a maximum integer not exceeding a quotient obtained by dividing an output '$r_k+3$' of the adder 430 by 4. An adder 432 adds 29 to the row index $r_k$ and provides its output to dividers 436 and 438. The divider 436 outputs a maximum integer not exceeding a quotient obtained by dividing an output '$r_k+29$' of the adder 432 by 32, and the divider 438 outputs a maximum integer not exceeding a quotient obtained by dividing the output '$r_k+29$' of the adder 432 by 128. An adder 440 calculates an address compensation factor $C(r_k)$ by adding an output of the divider 436 to an output of the divider 434 and then subtracting an output of the divider 438 from the addition result. An adder 326 finally calculates a read address $A_k$ by adding the address compensation factor $C(r_k)$ to the interim address $IA_k$.

Figure 12:
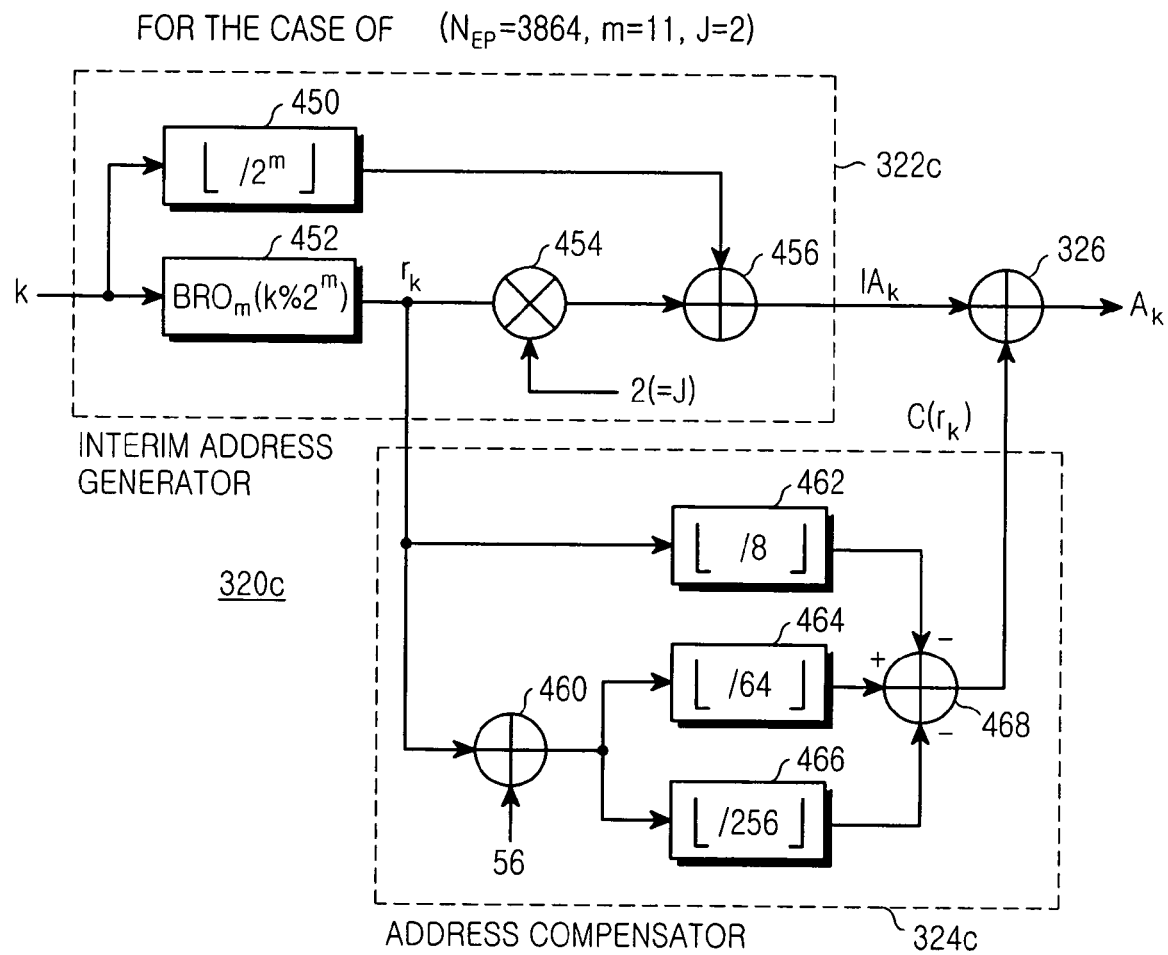
FIG. 12 illustrates a block diagram of a read address generator according to an embodiment of the present invention, for $N_{EP}$=3864.

FIG. 12 illustrates a block diagram 320c of the deinterleaving address generator 320 generating a read address for reading code symbols written in the input buffer 310, for $N_{EP}$=3864 (m=11 and J=2). This structure is a hardware device for implementing Equation (22).

As illustrated, if a desired code symbol index k is provided from the channel decoder 330 to an interim address generator 322c, a divider 450 provides an adder 456 with a maximum integer not exceeding a quotient obtained by dividing the code symbol index k by $2^m$. A BRO operator 452 groups bits obtained by dividing the code symbol index k by $2^m$, performs a BRO operation on a row index for symbols of each group by the m bits, and calculates a row index $r_k$ for the code symbol index k. A multiplier 454 multiplies the row index $r_k$ by 2 (=J) and provides its output to the adder 456. The adder 456 then calculates an interim address $IA_k$ by adding an output $2r_k$ of the multiplier 454 to an output $k/2^m$ of the divider 450.

If the row index $r_k$ is applied to an address compensator 324c, a divider 462 outputs a maximum integer not exceeding a quotient obtained by dividing the row index $r_k$ by 8. An adder 460 adds 56 to the row index $r_k$ and provides its output to dividers 464 and 466. The divider 464 outputs a maximum integer not exceeding a quotient obtained by dividing an output '$r_k$+56' of the adder 460 by 64, and the divider 466 outputs a maximum integer not exceeding a quotient obtained by dividing the output '$r_k$+56' of the adder 460 by 256. An adder 468 calculates an address compensation factor $C(r_k)$ by subtracting an output of the divider 462 and an output of the divider 466 from an output of the divider 464. An adder 326 finally calculates a read address $A_k$ by adding the address compensation factor $C(r_k)$ to the interim address $IA_k$.

Figure 13:
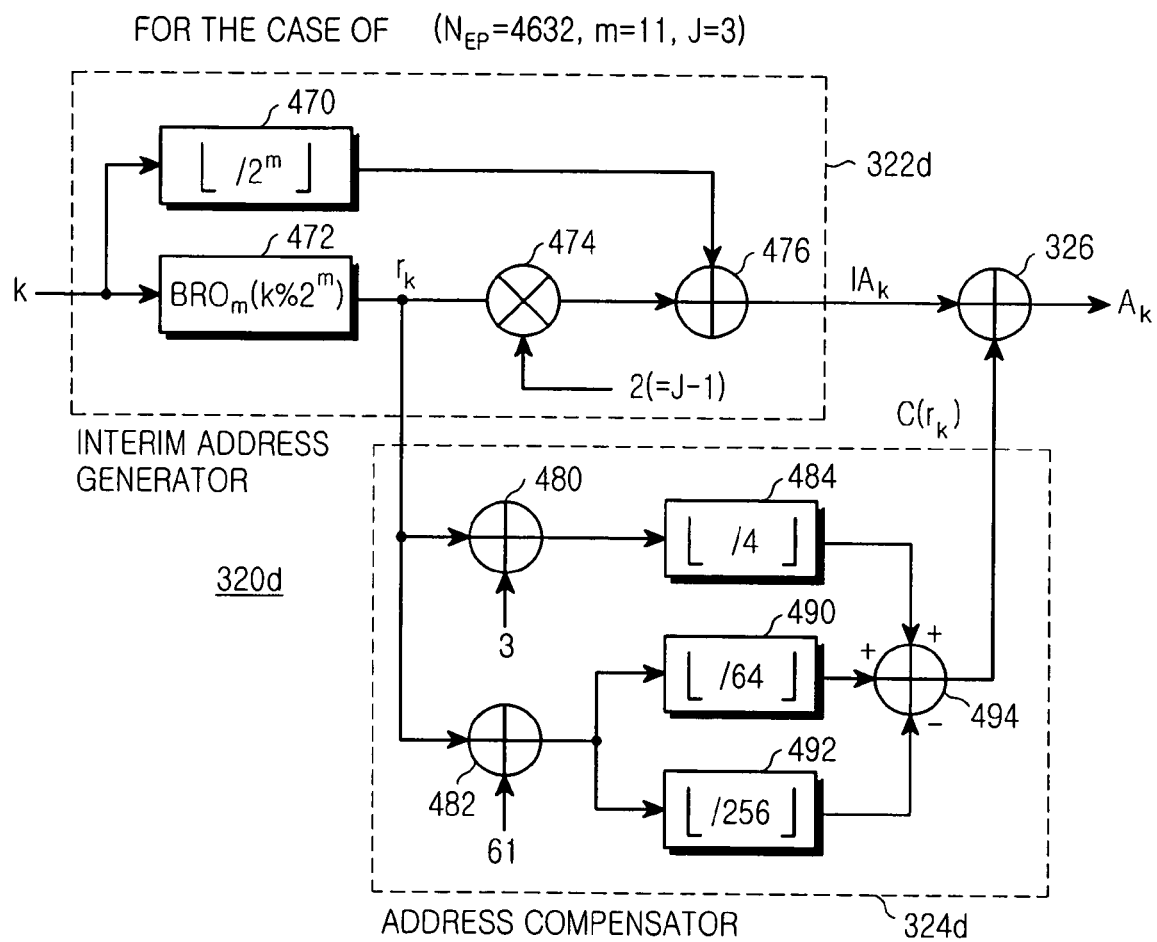
FIG. 13 illustrates a block diagram of a read address generator according to an embodiment of the present invention, for $N_{EP}$=4632.

FIG. 13 illustrates a block diagram 320d of the deinterleaving address generator 320 generating a read address for reading code symbols written in the input buffer 310, for $N_{EP}$=4632 (m=11 and J=3). This structure is a hardware device for implementing Equation (23).

As illustrated, if a desired code symbol index k is provided from the channel decoder 330 to an interim address generator 322d, a divider 470 provides an adder 476 with a maximum integer not exceeding a quotient obtained by dividing the code symbol index k by $2^m$.

A BRO operator 472 groups bits obtained by dividing the code symbol index k by $2^m$, performs a BRO operation on a row index for symbols of each group by the m bits, and calculates a row index $r_k$ for the code symbol index k. A multiplier 474 multiplies the row index $r_k$ by 2 (=J−1) and provides its output to the adder 476. The adder 476 then calculates an interim address $IA_k$ by adding an output $2r_k$ of the multiplier 474 to an output $k/2^m$ of the divider 470.

If the row index $r_k$ is applied to an address compensator 324d, an adder 480 adds 3 to the row index $r_k$, and a divider 484 outputs a maximum integer not exceeding a quotient obtained by dividing an output '$r_k$+3' of the adder 480 by 4. An adder 482 adds 61 to the row index $r_k$ and provides its output to dividers 490 and 492. The divider 490 outputs a maximum integer not exceeding a quotient obtained by dividing an output '$r_k$+61' of the adder 482 by 64, and the divider 492 outputs a maximum integer not exceeding a quotient obtained by dividing the output '$r_k$+61' of the adder 482 by 256. An adder 494 calculates an address compensation factor $C(r_k)$ by adding an output of the divider 484 to an output of the divider 490 and then subtracting an output of the divider 492 from the addition result. An adder 326 finally calculates a read address $A_k$ by adding the address compensation factor $C(r_k)$ to the interim address $IA_k$.

Figure 14:
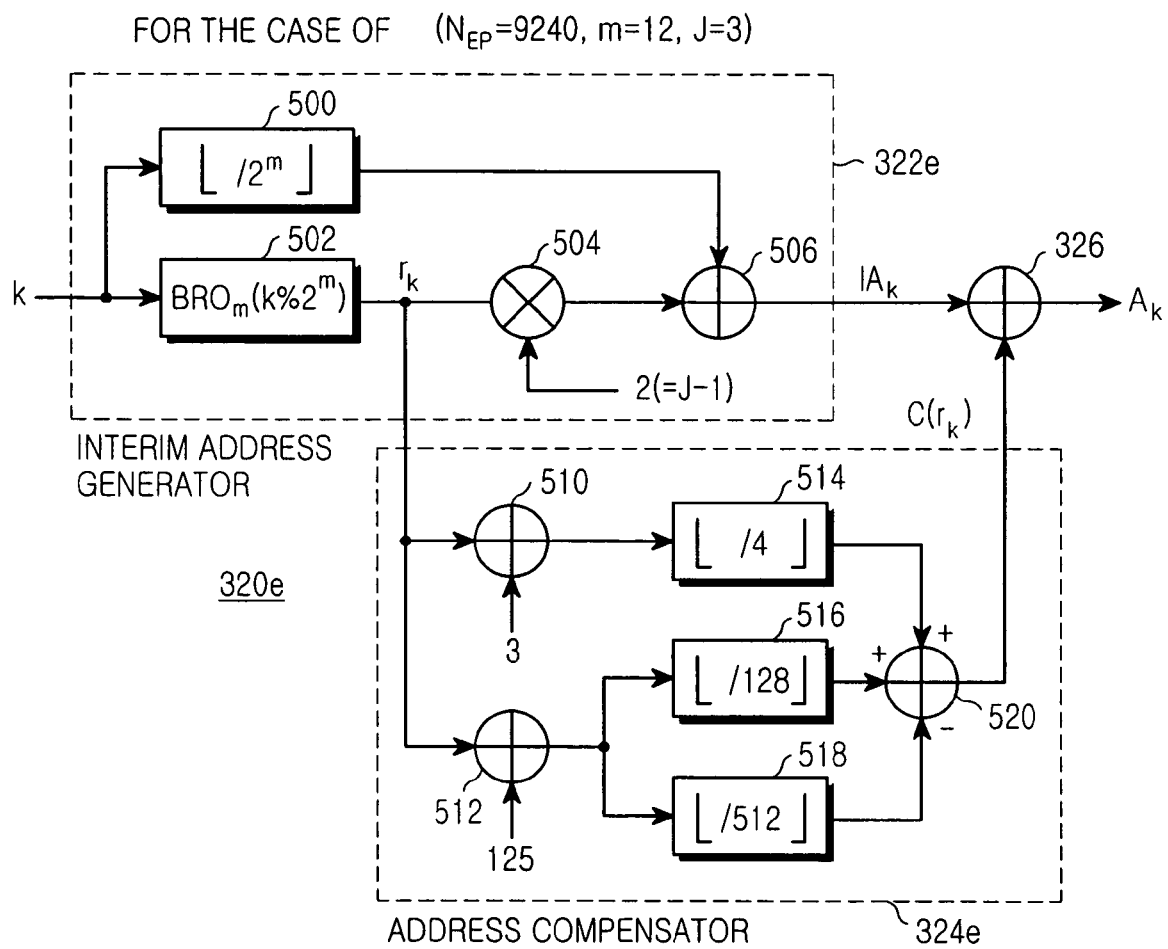
FIG. 14 illustrates a block diagram of a read address generator according to an embodiment of the present invention, for $N_{EP}$=9240.

FIG. 14 illustrates a block diagram 320e of the deinterleaving address generator 320 generating a read address for reading code symbols written in the input buffer 310, for $N_{EP}$=9240 (m=12 and J=3). This structure is a hardware device for implementing Equation (24).

As illustrated, if a desired code symbol index k is provided from the channel decoder 330 to an interim address generator 322e, a divider 500 provides an adder 506 with a maximum integer not exceeding a quotient obtained by dividing the code symbol index k by $2^m$. A BRO operator 502 groups bits obtained by dividing the code symbol index k by $2^m$, performs a BRO operation on a row index for symbols of each group by the m bits, and calculates a row index $r_k$ for the code symbol index k. A multiplier 504 multiplies the row index $r_k$ by 2 (=J−1) and provides its output to the adder 506. The adder 506 then calculates an interim address $IA_k$ by adding an output $2r_k$ of the multiplier 504 to an output $k/2^m$ of the divider 500.

If the row index $r_k$ is applied to an address compensator 324e, an adder 510 adds 3 to the row index $r_k$, and a divider 514 outputs a maximum integer not exceeding a quotient obtained by dividing an output '$r_k$+3' of the adder 510 by 4. An adder 512 adds 125 to the row index $r_k$ and provides its output to dividers 516 and 518. The divider 516 outputs a maximum integer not exceeding a quotient obtained by dividing an output '$r_k$+125' of the adder 512 by 128, and the divider 518 outputs a maximum integer not exceeding a quotient obtained by dividing the output '$r_k$+125' of the adder 512 by 512. An adder 520 calculates an address compensation factor $C(r_k)$ by adding an output of the divider 514 to an output of the divider 516 and then subtracting an output of the divider 518 from the addition result. An adder 326 finally calculates a read address $A_k$ by adding the address compensation factor $C(r_k)$ to the interim address $IA_k$.

Figure 15:
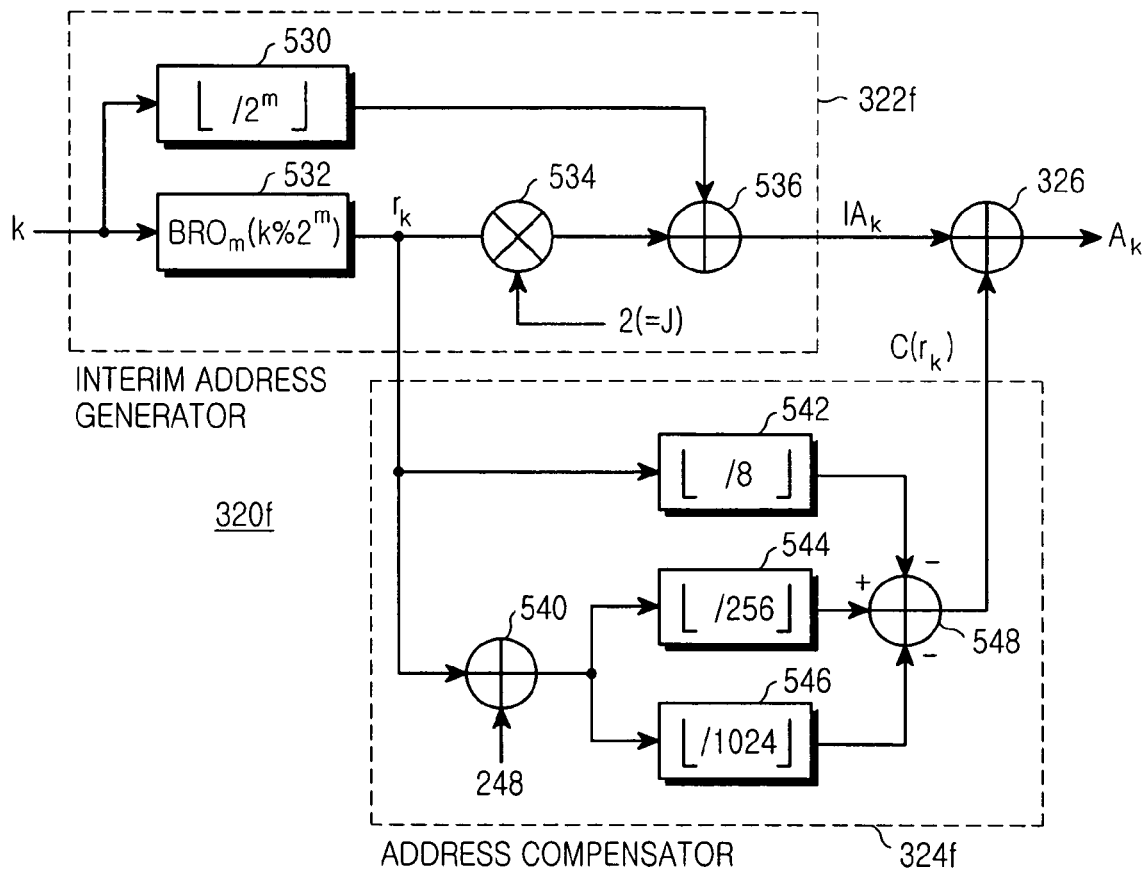
FIG. 15 illustrates a block diagram of a read address generator according to an embodiment of the present invention, for $N_{EP}$=15384.

FIG. 15 illustrates a block diagram 320f of the deinterleaving address generator 320 generating a read address for reading code symbols written in the input buffer 310, for $N_{EP}$=15384 (m=13 and J=2). This structure is a hardware device for implementing Equation (25).

As illustrated, if a desired code symbol index k is provided from the channel decoder 330 to an interim address generator 322f, a divider 530 provides an adder 536 with a maximum integer not exceeding a quotient obtained by dividing the code symbol index k by $2^m$. A BRO operator 532 groups bits obtained by dividing the code symbol index k by $2^m$, performs a BRO operation on a row index for symbols of each group by the m bits, and calculates a row index $r_k$ for the code symbol index k. A multiplier 534 multiplies the row index $r_k$ by 2 (=J) and provides its output to the adder 536. The adder 536 then calculates an interim address $IA_k$ by adding an output $2r_k$ of the multiplier 534 to an output $k/2^m$ of the divider 530.

If the row index $r_k$ is applied to an address compensator 324f, a divider 542 outputs a maximum integer not exceeding a quotient obtained by dividing the row index $r_k$ by 8. An adder 540 adds 248 to the row index $r_k$ and provides its output to dividers 544 and 546. The divider 544 outputs a maximum integer not exceeding a quotient obtained by dividing an output '$r_k$+248' of the adder 540 by 256, and the divider 546 outputs a maximum integer not exceeding a quotient obtained by dividing the output '$r_k$+248' of the adder 540 by 1024. An adder 548 calculates an address compensation factor $C(r_k)$ by subtracting an output of the divider 542 and an output of the divider 546 from an output of the divider 544. An adder 326 finally calculates a read address $A_k$ by adding the address compensation factor $C(r_k)$ to the interim address $IA_k$.

The embodiment of the present invention has the following advantages. In a mobile communication system using a deinterleaving rule specified in a 1xEV-DV standard, the embodiment of the present invention deinterleaves a stream of interleaved data at high speed to restore an original encoder packet. In particular, the present invention writes subblocks of received code symbols in a memory, reads the code symbols according to read addresses generated according to a deinterleaving rule, and provides the read code symbols to a decoder, thereby minimizing the required memory capacity and the number of hardware elements necessary for calculating read addresses. By doing so, it is possible to guarantee miniaturization and power reduction of a receiver. In addition, the present invention performs deinterleaving on subblocks separately, so a decoder can simultaneously decode a plurality of subblocks, thereby increasing a decoding speed and enabling high-speed data communication.

While the invention has been shown and described with reference to certain embodiments thereof, it will be understood by those skilled in the art that various changes in form and details may be made therein without departing from the spirit and scope of the invention as defined by the appended claims.

What is claimed is:

1. A method for reading code symbols by deinterleaving to decode an encoder packet in a receiver for a mobile communication system supporting interleaving, wherein an interleaved encoder packet has ($2^m$*J+R) bits, a bit shift value m, an up-limit value J and a remainder R, wherein the code symbols are written in the format of a $2^m$*J matrix and R is the number of remaining bits in the last column J, the method comprising the steps of:

generating an interim address by bit reversal order (BRO) operation on an index of a code symbol by excluding the last column when the number of the code symbols of the last column is less than a half of $2^m$ code symbols, and generating the interim address by including the last column when the number of the code symbols of the last column is more than or equal to a half of $2^m$ code symbols;

calculating an address compensation factor for compensating the interim address based on the real number of R code symbols written in the last column J by increasing the address compensation factor by one each time a code symbol appears in the last column when the last column has less than a half of $2^m$ code symbols, and decreasing the address compensation factor by one each time a code symbol is excluded from the last column when the last column has more than or equal to a half of $2^m$ code symbols;

generating a read address by adding the interim address and the address compensation factor for the code symbol, reading the code symbol written in the generated read address; and decoding the code symbol read from the generated read address.

2. The method of claim 1, wherein if a size of the subblock is 408, the read address is generated in accordance with the equation $$A_k = 3 \cdot BRO_7(k \bmod 128) + \lfloor k/128 \rfloor + \left\lfloor \frac{BRO_7(k \bmod 128) + 3}{4} \right\rfloor - \left\lfloor \frac{BRO_7(k \bmod 128) + 3}{16} \right\rfloor$$

where $A_k$ is the read address, k is an index of the code symbol, BRO means a BRO operation, mod means a modulo operation, and $\lfloor \bullet \rfloor$ means a maximum integer not exceeding an input "$\bullet$".

3. The method of claim 1, wherein if a size of the subblock is 792, the read address is generated in accordance with the equation $$A_k = 3 \cdot BRO_8(k \bmod 256) + \lfloor k/256 \rfloor + \left\lfloor \frac{BRO_8(k \bmod 256) + 7}{8} \right\rfloor - \left\lfloor \frac{BRO_8(k \bmod 256) + 7}{32} \right\rfloor$$

where $A_k$ is the read address, k is an index of the code symbol, BRO means a BRO operation, mod means a modulo operation, and $\lfloor \bullet \rfloor$ means a maximum integer not exceeding an input "$\bullet$".

4. The method of claim 1, wherein if a size of the subblock is 1560, the read address is generated in accordance with the equation $$A_k = 3 \cdot BRO_9(k \bmod 512) + \lfloor k/512 \rfloor + \left\lfloor \frac{BRO_9(k \bmod 512) + 15}{16} \right\rfloor - \left\lfloor \frac{BRO_9(k \bmod 512) + 15}{64} \right\rfloor$$

where $A_k$ is the read address, k is an index of the code symbol, BRO means a BRO operation, mod means a modulo operation, and $\lfloor \bullet \rfloor$ means a maximum integer not exceeding an input "$\bullet$".

5. The method of claim 1, wherein if a size of the subblock is 3096, the read address is generated in accordance with the equation $$A_k = 3 \cdot BRO_{10}(k \bmod 1024) + \lfloor k/1024 \rfloor + \left\lfloor \frac{BRO_{10}(k \bmod 1024) + 31}{32} \right\rfloor - \left\lfloor \frac{BRO_{10}(k \bmod 1024) + 31}{128} \right\rfloor$$

where $A_k$ is the read address, k is an index of the code symbol, BRO means a BRO operation, mod means a modulo operation, and $\lfloor \bullet \rfloor$ means a maximum integer not exceeding an input "$\bullet$".

6. The method of claim 1, wherein if a size of the subblock is 6168, the read address is generated in accordance with the equation $$A_k = 3 \cdot BRO_{11}(k \bmod 2048) + \lfloor k/2048 \rfloor + \left\lfloor \frac{BRO_{11}(k \bmod 2048) + 63}{64} \right\rfloor - \left\lfloor \frac{BRO_{11}(k \bmod 2048) + 63}{256} \right\rfloor$$

where $A_k$ is the read address, k is an index of the code symbol, BRO means a BRO operation, mod means a modulo operation, and $\lfloor \bullet \rfloor$ means a maximum integer not exceeding an input "$\bullet$".

7. The method of claim 1, wherein if a size of the subblock is 12312, the read address is generated in accordance with the equation $$A_k = 3 \cdot BRO_{12}(k \bmod 4096) + \lfloor k/4096 \rfloor + \left\lfloor \frac{BRO_{12}(k \bmod 4096) + 127}{128} \right\rfloor - \left\lfloor \frac{BRO_{12}(k \bmod 4096) + 127}{512} \right\rfloor$$

where $A_k$ is the read address, k is an index of the code symbol, BRO means a BRO operation, mod means a modulo operation, and $\lfloor \bullet \rfloor$ means a maximum integer not exceeding an input "$\bullet$".

8. The method of claim 1, wherein if a size of the subblock is 2328, the read address is generated in accordance with the equation $$A_k = 2 \cdot BRO_{10}(k \bmod 2^{10}) + \left\lfloor \frac{k}{2^{10}} \right\rfloor + \left\lfloor \frac{BRO_{10}(k \bmod 2^{10}) + 3}{4} \right\rfloor +$$
$$\left\lfloor \frac{BRO_{10}(k \bmod 2^{10}) + 29}{32} \right\rfloor - \left\lfloor \frac{BRO_{10}(k \bmod 2^{10}) + 29}{128} \right\rfloor$$

where $A_k$ is the read address, k is an index of the code symbol, BRO means a BRO operation, mod means a modulo operation, and $\lfloor \bullet \rfloor$ means a maximum integer not exceeding an input "$\bullet$".

9. The method of claim 1, wherein if a size of the subblock is 3864, the read address is generated in accordance with the equation $$A_k = 2 \cdot BRO_{11}(k \bmod 2^{11}) + \left\lfloor \frac{k}{2^{11}} \right\rfloor - \left\lfloor \frac{BRO_{11}(k \bmod 2^{11})}{8} \right\rfloor +$$
$$\left\lfloor \frac{BRO_{11}(k \bmod 2^{11}) + 56}{64} \right\rfloor - \left\lfloor \frac{BRO_{11}(k \bmod 2^{11}) + 56}{256} \right\rfloor$$

where $A_k$ is the read address, k is an index of the code symbol, BRO means a BRO operation, mod means a modulo operation, and $\lfloor \bullet \rfloor$ means a maximum integer not exceeding an input "$\bullet$".

10. The method of claim 1, wherein if a size of the subblock is 4632, the read address is generated in accordance with the equation $$A_k = 2 \cdot BRO_{11}(k \bmod 2^{11}) + \left\lfloor \frac{k}{2^{11}} \right\rfloor + \left\lfloor \frac{BRO_{11}(k \bmod 2^{11}) + 3}{4} \right\rfloor +$$
$$\left\lfloor \frac{BRO_{11}(k \bmod 2^{11}) + 61}{64} \right\rfloor - \left\lfloor \frac{BRO_{11}(k \bmod 2^{11}) + 61}{256} \right\rfloor$$

where $A_k$ is the read address, k is an index of the code symbol, BRO means a BRO operation, mod means a modulo operation, and $\lfloor \bullet \rfloor$ means a maximum integer not exceeding an input "$\bullet$".

11. The method of claim 1, wherein if a size of the subblock is 9240, the read address is generated in accordance with the equation $$A_k = 2 \cdot BRO_{12}(k \bmod 2^{12}) + \left\lfloor \frac{k}{2^{12}} \right\rfloor + \left\lfloor \frac{BRO_{12}(k \bmod 2^{12}) + 3}{4} \right\rfloor +$$
$$\left\lfloor \frac{BRO_{12}(k \bmod 2^{12}) + 125}{128} \right\rfloor - \left\lfloor \frac{BRO_{12}(k \bmod 2^{12}) + 125}{512} \right\rfloor$$

where $A_k$ is the read address, k is an index of the code symbol, BRO means a BRO operation, mod means a modulo operation, and $\lfloor \bullet \rfloor$ means a maximum integer not exceeding an input "$\bullet$".

12. The method of claim 1, wherein if a size of the subblock is 15384, the read address is generated in accordance with the equation $$A_k = 2 \cdot BRO_{13}(k \bmod 2^{13}) + \left\lfloor \frac{k}{2^{13}} \right\rfloor - \left\lfloor \frac{BRO_{13}(k \bmod 2^{13})}{8} \right\rfloor +$$

-continued
$$\left\lfloor \frac{BRO_{13}(k \bmod 2^{13}) + 248}{256} \right\rfloor - \left\lfloor \frac{BRO_{13}(k \bmod 2^{13}) + 248}{1024} \right\rfloor$$

where $A_k$ is the read address, k is an index of the code symbol, BRO means a BRO operation, mod means a modulo operation, and $\lfloor \bullet \rfloor$ means a maximum integer not exceeding an input "$\bullet$".

13. The method of claim 1, wherein the address compensation factor calculation step comprises the step of calculating an address compensation factor by the following equation when the last column has less than a half of $2^m$ code symbols;

$$C_d^+(r_k) = \left\lfloor \frac{r_k + d - (r^+ + 1)}{d} \right\rfloor$$

where "d" is a value determined by dividing the total number of rows by the number of code symbols to be inserted, "$r^+$" is an index of a row where a first inserted code symbol is located among the remaining code symbols inserted in the last column, and "+" in a address compensation factor $C_d^+$ indicates that a code symbol is "inserted" in the last column.

14. The method of claim 1, wherein the address compensation factor calculation step comprises the step of calculating an address compensation factor by the following equation when the last column has more than or equal to a half of $2^m$ code symbols;

$$C_d^-(r_k) = -\left\lfloor \frac{r_k + d - (r^- + 1)}{d} \right\rfloor$$

where "d" is a value determined by dividing the total number of rows by the number of code symbols to be excluded, "$r^{31}$" is an index of a row where a first excluded code symbol is located, and "−" in $C_d^-$ indicates that a code symbol is "excluded" from the last column.

15. The method of claim 1 wherein, when the number of code symbols of the last column is less than half of $2^m$ code symbols, the step of generating the interim address further comprises:
  performing BRO operation on a column index of the code symbol;
  multiplying the BRO operated column index by the integer determined by (J−1); and
  adding a column index of the code symbol to the product determined in the multiplying step; wherein
  the column index of the code symbol is a quotient generated by dividing the code symbol index k into $2^m$.

16. The method of claim 1 wherein, when the number of code symbols of the last column is equal to or more than half of $2^m$ code symbols, the step of generating the interim address further comprises:
  performing BRO operation on a column index of the code symbol;
  multiplying the BRO operated column index by the integer represented by J; and
  adding a column index of the code symbol to the product determined in the multiplying step; wherein
  the column index of the code symbol is a quotient generated by dividing the code symbol index k into $2^m$.

* * * * *